(12) United States Patent
Ide et al.

(10) Patent No.: US 12,464,648 B2
(45) Date of Patent: Nov. 4, 2025

(54) STORAGE DEVICE HAVING CAPACITORS IN A HOUSING

(71) Applicant: Kioxia Corporation, Tokyo (JP)

(72) Inventors: Ichiro Ide, Fujisawa (JP); Kengo Kumagai, Yokohama (JP)

(73) Assignee: Kioxia Corporation, Tokyo (JP)

( * ) Notice: Subject to any disclaimer, the term of this patent is extended or adjusted under 35 U.S.C. 154(b) by 146 days.

(21) Appl. No.: 17/693,098

(22) Filed: Mar. 11, 2022

(65) Prior Publication Data

US 2023/0088785 A1 Mar. 23, 2023

(30) Foreign Application Priority Data

Sep. 21, 2021 (JP) ................................. 2021-153607

(51) Int. Cl.
*H05K 1/18* (2006.01)
*H05K 5/00* (2006.01)

(52) U.S. Cl.
CPC ........... *H05K 1/181* (2013.01); *H05K 5/0026* (2013.01); *H05K 2201/10015* (2013.01); *H05K 2201/10159* (2013.01)

(58) Field of Classification Search
CPC ............................. H05K 5/006; H05K 5/0026
See application file for complete search history.

(56) References Cited

U.S. PATENT DOCUMENTS

| | | | | |
|---|---|---|---|---|
| 5,070,258 A * | 12/1991 | Izumi | ............... | G01R 31/31701 361/737 |
| 5,274,570 A * | 12/1993 | Izumi | ................. | H01R 13/6658 361/764 |
| 6,181,571 B1 * | 1/2001 | Sugimoto | ............... | H05K 1/165 361/752 |
| 7,102,085 B2 * | 9/2006 | Ohta | ...................... | H01L 23/642 257/E21.511 |
| 7,327,554 B2 * | 2/2008 | Otsuka | .................. | H05K 1/0231 257/E23.079 |
| 7,932,471 B2 * | 4/2011 | Yamamoto | ............. | H01G 4/232 361/792 |
| 8,035,216 B2 * | 10/2011 | Skeete | ..................... | H01L 23/50 438/106 |
| 8,264,846 B2 * | 9/2012 | Jones | ................... | H05K 1/0231 361/792 |
| 8,514,565 B2 | 8/2013 | Foo et al. | | |
| 9,042,105 B2 * | 5/2015 | Malek | ...................... | H05K 3/42 361/752 |
| 9,377,825 B2 * | 6/2016 | Shinohara | ............... | H01L 24/49 |
| 9,936,580 B1 * | 4/2018 | Vinciarelli | ........... | B23K 1/0016 |
| 10,903,734 B1 * | 1/2021 | Vinciarelli | ........... | H05K 1/0298 |

(Continued)

FOREIGN PATENT DOCUMENTS

| | | |
|---|---|---|
| JP | 2008-257702 | 10/2008 |
| JP | 2019-106227 | 6/2019 |

*Primary Examiner* — Allen L Parker
*Assistant Examiner* — Douglas R Burtner
(74) *Attorney, Agent, or Firm* — Oblon, McClelland, Maier & Neustadt, L.L.P.

(57) ABSTRACT

A storage device according to an embodiment includes a housing, a first board, a memory, and a capacitor. The first board is housed in the housing. The memory is mounted on the first board. The capacitor is in contact with one of the housing and a second board. The capacitor is electrically connected to the first board. The second board is housed in the housing.

20 Claims, 22 Drawing Sheets

(56) References Cited

U.S. PATENT DOCUMENTS

| | | | | |
|---|---|---|---|---|
| 11,336,167 | B1* | 5/2022 | Vinciarelli | H05K 1/0298 |
| 11,477,885 | B2* | 10/2022 | Zhang | H05K 1/117 |
| 12,191,576 | B2* | 1/2025 | Jo | H01Q 9/045 |
| 12,334,680 | B2* | 6/2025 | Morgan | H01R 12/75 |
| 2012/0119757 | A1* | 5/2012 | Nakamura | G01R 31/001 |
| | | | | 324/613 |
| 2012/0155043 | A1* | 6/2012 | Miyasaka | H05K 1/0231 |
| | | | | 361/782 |
| 2015/0085903 | A1* | 3/2015 | Gundel | H05K 5/0026 |
| | | | | 375/219 |
| 2017/0105306 | A1* | 4/2017 | Takahashi | H05K 5/0026 |
| 2017/0127540 | A1* | 5/2017 | You | H05K 9/0007 |
| 2018/0249585 | A1* | 8/2018 | Yoshida | H05K 1/181 |
| 2019/0180819 | A1* | 6/2019 | Yamasaki | G11C 5/04 |
| 2019/0254182 | A1* | 8/2019 | Nakatsu | H05K 5/0026 |
| 2020/0214151 | A1* | 7/2020 | Su | H05K 5/0069 |
| 2021/0112674 | A1* | 4/2021 | Ehlen | H05K 5/0026 |
| 2022/0037074 | A1* | 2/2022 | Tashiro | H02M 3/33576 |
| 2022/0344286 | A1* | 10/2022 | Kojima | H02M 3/003 |
| 2023/0111374 | A1* | 4/2023 | Kano | H01G 4/005 |
| | | | | 257/531 |
| 2023/0189442 | A1* | 6/2023 | Radhakrishnan | H05K 1/181 |
| | | | | 361/763 |
| 2023/0209738 | A1* | 6/2023 | Sugahara | H05K 5/006 |
| 2024/0008167 | A1* | 1/2024 | Li | H05K 1/144 |
| 2024/0324114 | A1* | 9/2024 | Han | H05K 5/0073 |

* cited by examiner

STORAGE DEVICE HAVING CAPACITORS IN A HOUSING

CROSS-REFERENCE TO RELATED APPLICATION

This application is based upon and claims the benefit of priority from Japanese Patent Application No. 2021-153607, filed Sep. 21, 2021; the entire contents of which are incorporated herein by reference.

FIELD

Embodiments described herein relate generally to a storage device.

BACKGROUND

A storage device having a board and a memory mounted on the board is known. It is expected that the manufacturability of such a storage device will be improved.

DETAILED DESCRIPTION

Figure 1:
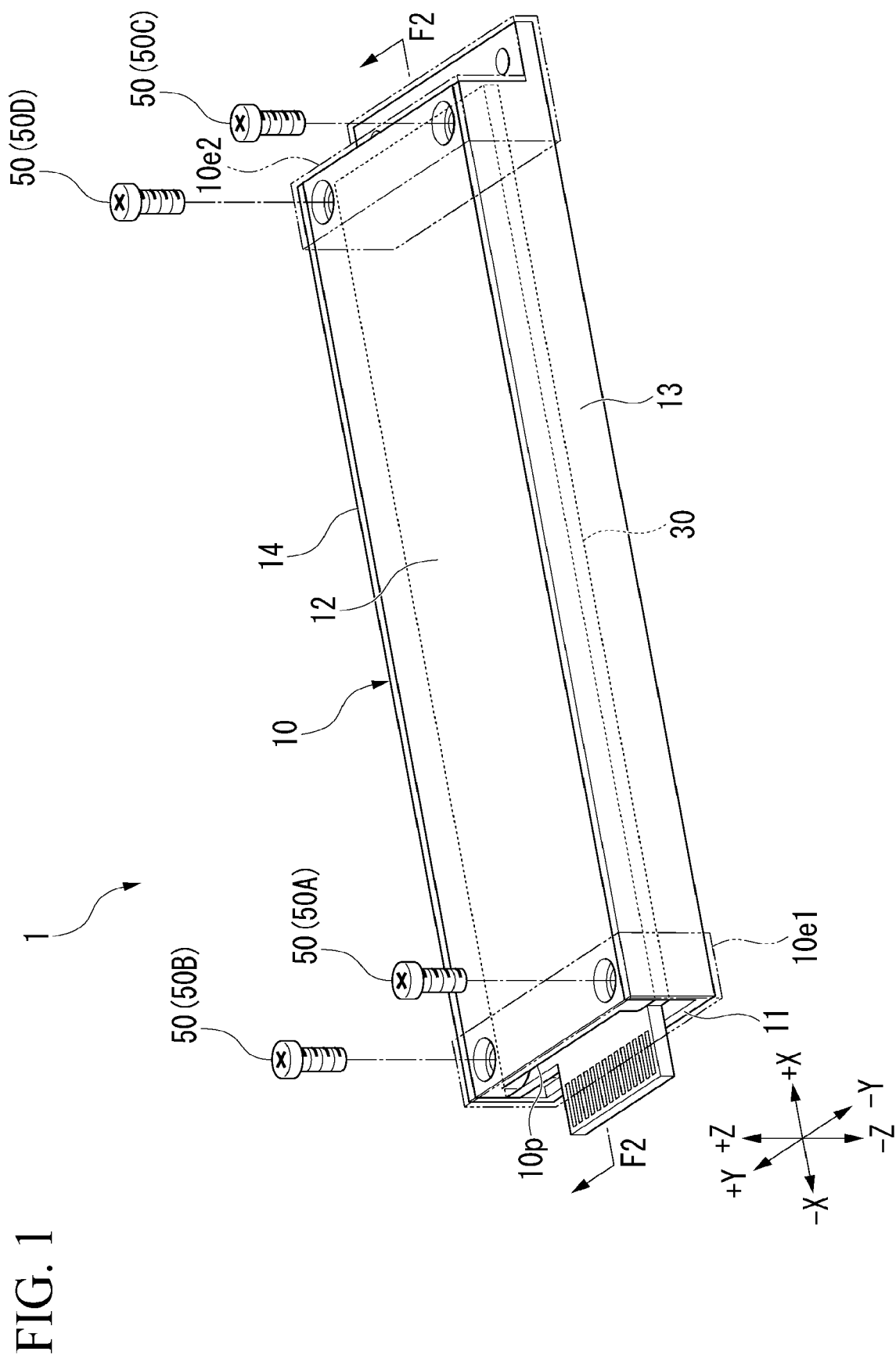
FIG. 1 is a partially exploded perspective view showing a semiconductor storage device according to a first embodiment.

A storage device according to an embodiment includes a housing, a first board, a memory, and a capacitor. The first board is housed in the housing. The memory is mounted on the first board. The capacitor is in contact with one of the housing and a second board. The capacitor is electrically connected to the first board. The second board is housed in the housing.

Hereinafter, a storage device according to an embodiment will be described with reference to the drawings. In the following description, the same reference numerals are given to components having the same or similar function. Duplicate description of these components may be omitted. In the present application, "parallel" may mean "substantially parallel". In the present application, "orthogonal" may mean "substantially orthogonal". In the present application, "same" may mean "substantially same". In the present application, "connection" may mean "electrical connection". That is, in the present application, "connect" is not limited to a case in which two members are adjacent to each other with nothing interposed therebetween, and also may include a case in which another member is interposed between the two members. In the present application, even where the number of boards included in a semiconductor storage device is one, the board may be referred to as "first board". In addition, "memory" is not limited to a memory device configured to store data depending on a stored state of electric charge but may be a memory device configured to store data depending on a magnetic state, an electrical resistance state, or the like. Moreover, "storage device" may be a storage device not using a semiconductor memory.

First of all, a +X direction, a −X direction, a +Y direction, a −Y direction, a +Z direction, and a −Z direction will be defined in advance. The +X direction, the −X direction, the +Y direction, and the −Y direction are directions parallel to a first main wall 11 of a housing 10 which will be described below (refer to FIG. 3). The +X direction is a direction from a first end portion 10e1 toward a second end portion 10e2 of the housing 10 which will be described below (refer to FIG. 1). The −X direction is a direction opposite to the +X direction. When the +X direction and the −X direction are not distinguished from each other, they will be simply referred to as "X direction". The +Y direction and the −Y direction are each a direction intersecting with (for example, orthogonal to) the X direction. The +Y direction is a direction from a first side wall 13 toward a second side wall 14 of the housing 10 which will be described below (refer to FIG. 1). The −Y direction is a direction opposite to the +Y direction. When the +Y direction and the −Y direction are not distinguished from each other, they will be simply referred to as "Y direction".

The +Z direction and the −Z direction are each a direction intersecting with (for example, orthogonal to) the X direction and the Y direction. The +Z direction is a direction from the first main wall 11 toward a second main wall 12 of the housing 10 which will be described below (refer to FIG. 3). The −Z direction is a direction opposite to the +Z direction. When the +Z direction and the −Z direction are not distinguished from each other, they will be simply referred to as "Z direction". The Z direction is a thickness direction of a board 31 which will be described below. In the present application, for convenience of explanation, a side in the +Z direction may be referred to as "upper", and a side in the −Z direction may be referred to as "lower". However, they are not limited to a direction of gravitational force.

First Embodiment 1.1 Overall Structure

A semiconductor storage device 1 according to the first embodiment will be described with reference to FIGS. 1 to 14. The semiconductor storage device 1 is an example of "storage device". The semiconductor storage device 1 is a storage device, for example, SSD (Solid State Drive). The semiconductor storage device 1 is attached to an information processor such as a server, a personal computer, or the like. The semiconductor storage device 1 is used as a storage area of the information processor. In the present application, the information processor to be attached to the semiconductor storage device 1 is referred to as "host device".

FIG. 1 is a partially exploded perspective view showing the semiconductor storage device 1. The semiconductor storage device 1 includes, for example, a housing 10, a board unit 30, a plurality of fixing members 50, and a plurality of capacitors 40.

1.2 Housing

First of all, the housing 10 will be described. The housing 10 is a member forming an external shape of the semiconductor storage device 1. The shape of the housing 10 is a flat rectangular tube. The housing 10 includes a first end portion 10e1, a second end portion 10e2, a first main wall 11 (lower wall), a second main wall 12 (upper wall), a first side wall 13, and a second side wall 14.

The first end portion 10e1 and the second end portion 10e2 are end portions in a longitudinal direction (the X direction). The first end portion 10e1 is the end portion on a side in the −X direction. The second end portion 10e2 is the end portion on a side in the +X direction. The second end portion 10e2 is located on the opposite side of the first end portion 10e1.

The first main wall 11 is an example of "first wall portion". The shape of the first main wall 11 is a plate. The first main wall 11 is located at the end portion on the side in the −Z direction of the housing 10. The first main wall 11 is exposed to the outside of the housing 10. The first main wall 11 is located on the side in the −Z direction with respect to the board unit 30. In the embodiment, the first main wall 11 includes a body part 11a and an insulating layer 11b. The body part 11a forms most of the first main wall 11. The body part 11a is a part of a metal portion M1 of a first housing member 21 which will be described below. The insulating layer 11b is provided on a surface of the body part 11a. The insulating layer 11b is a part of an insulating layer 11 of the first housing member 21 which will be described below.

The second main wall 12 is an example of "second wall portion". The shape of the second main wall 12 is a plate. The second main wall 12 is located at the end portion on the side in the +Z direction of the housing 10. The second main wall 12 is exposed to the outside of the housing 10. The second main wall 12 is spaced apart from the first main wall 11 in the Z direction. The second main wall 12 is parallel to the first main wall 11. The second main wall 12 is located on the side in the +Z direction with respect to the board unit 30.

The shape of the first side wall 13 is a plate. The first side wall 13 is located at the end portion on a side in the −Y direction of the housing 10. The first side wall 13 is exposed to the outside of the housing 10. The first side wall 13 extends between the first main wall 11 and the second main wall 12 in the Z direction. The first side wall 13 is located on the side in the −Y direction with respect to the board unit 30.

The shape of the second side wall 14 is a plate. The second side wall 14 is located at the end portion on a side in the +Y direction of the housing 10. The second side wall 14 is exposed to the outside of the housing 10. The second side wall 14 extends between the first main wall 11 and the second main wall 12 in the Z direction. The second side wall 14 is located on the side in the +Y direction with respect to the board unit 30.

Figure 2:
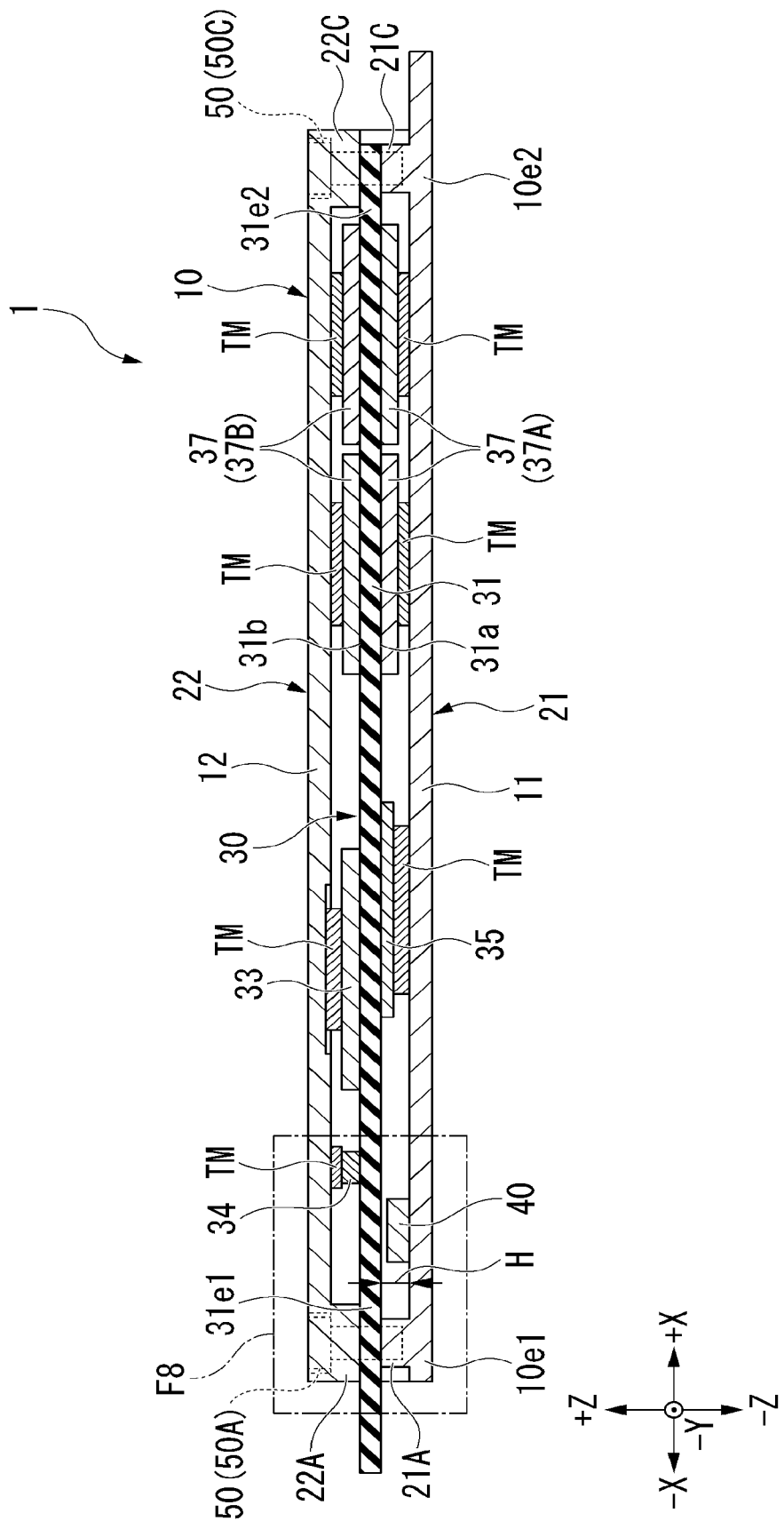
FIG. 2 is a cross-sectional view taken along line F2-F2 of the semiconductor storage device shown in FIG. 1.

Next, arrangement of the first main wall 11 and the second main wall 12 will be particularly described. FIG. 2 a cross-sectional view taken along line F2-F2 of the semiconductor storage device shown in FIG. 1.

The first main wall 11 faces a power supply circuit component 35 (power supply circuit device) and a plurality of first memories 37A which will be described below on the side in the −Z direction. The first main wall 11 is connected to the power supply circuit component 35 and the plurality of the first memories 37A with a thermal conductive member TM (for example, heat conductive sheet) interposed therebetween.

The second main wall 12 faces a controller 33, a power converter 34, and a plurality of second memories 37B which will be described below on the side in the +Z direction. The second main wall 12 is connected to the controller 33, the power converter 34, and the plurality of the second memories 37B with a thermal conductive member TM (for example, heat conductive sheet) interposed therebetween.

Figure 3:
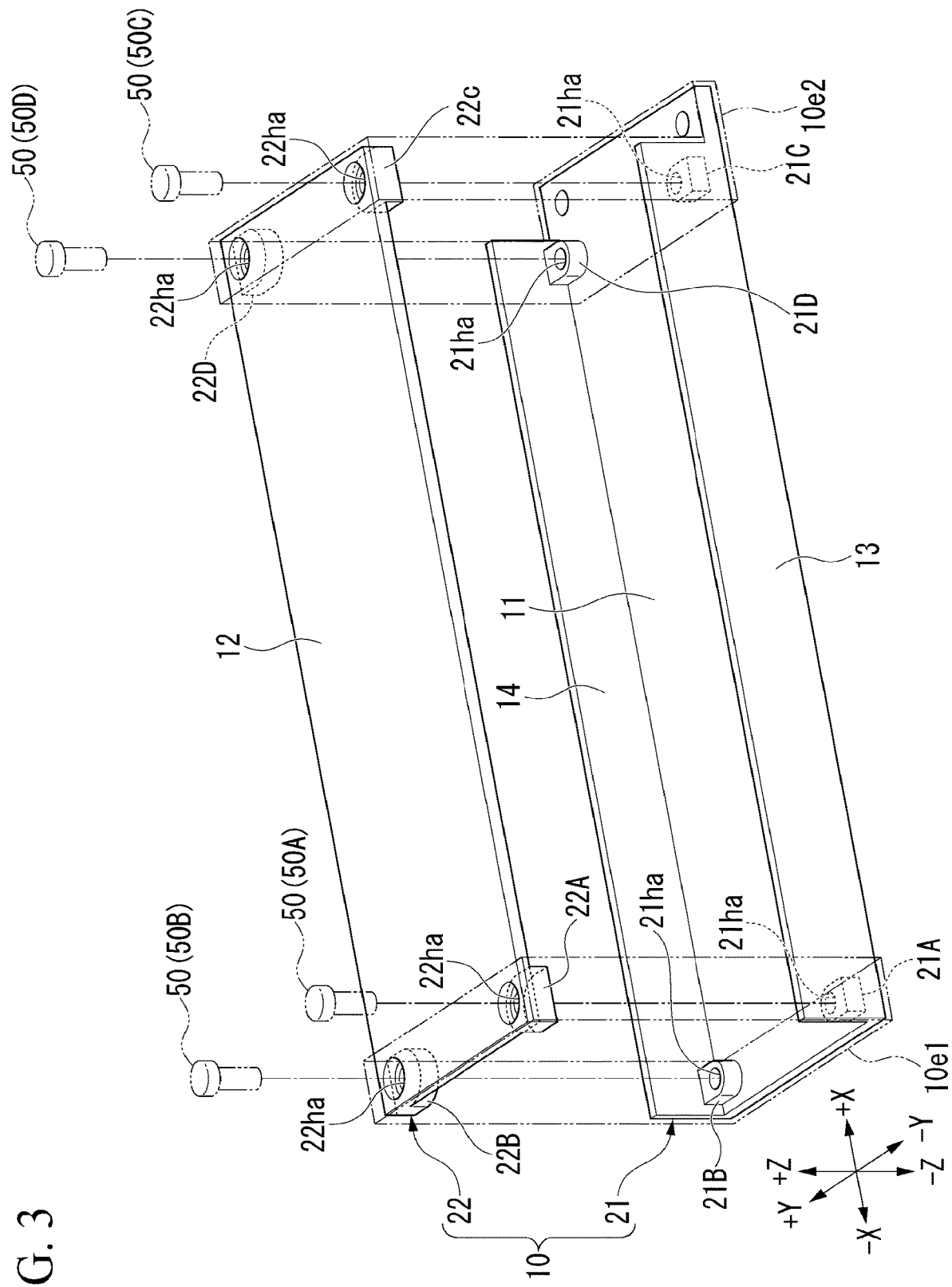
FIG. 3 is an exploded perspective view showing a housing according to the first embodiment.

Next, members constituting the housing 10 will be described. FIG. 3 is an exploded perspective view showing the housing 10. The housing 10 can be separated into the first housing member 21 and a second housing member 22. In the embodiment, the housing 10 is formed by assembling the first housing member 21 and the second housing member 22.

The first housing member 21 is an example of "first member". The first housing member 21 includes the first main wall 11, the first side wall 13, and the second side wall 14, which are described above. Furthermore, the first housing member 21 includes a first support portion 21A, a second support portion 21B, a third support portion 21C, a fourth support portion 21D, the metal portion M1, the insulating layer I1, a first conductive pad CP1, a wiring W1, and an electrical connection portion EC.

The first support portion 21A and the second support portion 21B are provided at the first end portion 10e1 of the housing 10. The first support portion 21A is provided at an end portion of the first main wall 11 on the side in the −Y direction. The second support portion 21B is provided at an end portion of the first main wall 11 on the side in the +Y direction. The first support portion 21A and the second support portion 21B protrude from the first main wall 11 in the +Z direction. A fixation hole 21ha which will be described below is provided on each of the first support portion 21A and the second support portion 21B. The fixing member 50 is inserted into the fixation hole 21ha. The fixation hole 21ha is, for example, a screw hole.

The third support portion 21C and the fourth support portion 21D are provided at the second end portion 10e2 of the housing 10. The third support portion 21C is provided at an end portion of the first main wall 11 on the side in the −Y direction. The fourth support portion 21D is provided at an end portion of the first main wall 11 on the side in the +Y direction. The third support portion 21C and the fourth support portion 21D protrude from the first main wall 11 in the +Z direction. The fixation hole 21ha is provided on each of the third support portion 21C and the fourth support portion 21D. The fixing member 50 is inserted into the fixation hole 21ha. The fixation hole 21ha is, for example, a screw hole.

The metal portion M1 is a metal portion included in the first housing member 21. The metal portion M1 is, for example, aluminum or an aluminum alloy. The metal portion M1 forms a main part of the first housing member 21. The metal portion M1 has electroconductivity. The metal portion M1 functions as ground of the semiconductor storage device 1.

The insulating layer I1 is an insulating layer included in the first housing member 21. The insulating layer I1 is provided on a surface of the metal portion M1.

The insulating layer I1 is provided on, for example, both surfaces of the metal portion M1. The insulating layer I1 forms a part of an inner surface of the housing 10. In the present application, "provided on an inner surface of the housing 10" may mean a case of "provided on the insulating layer I1".

The first conductive pad CP1, the wiring W1, and the electrical connection portion EC will be described below.

The second housing member 22 is an example of "second member". The second housing member 22 includes the aforementioned second main wall 12.

Moreover, the second housing member 22 includes a fifth support portion 22A, a sixth support portion 22B, a seventh support portion 22C, an eighth support portion 22D, a metal portion M2, an insulating layer I2, and a second conductive pad CP2.

The fifth support portion 22A and the sixth support portion 22B are provided at the first end portion 10e1 of the housing 10. The fifth support portion 22A is provided at an end portion of the second main wall 12 on the side in the −Y direction. The fifth support portion 22A is disposed at a position at which the fifth support portion 22A overlaps the first support portion 21A of the first housing member 21 when viewed from the Z direction. The sixth support portion 22B is provided at an end portion of the second main wall 12 on the side in the +Y direction. The sixth support portion 22B is disposed at a position at which the sixth support portion 22B overlaps the second support portion 21B of the first housing member 21 when viewed from the Z direction. The fifth support portion 22A and the sixth support portion 22B protrude from the second main wall 12 in the −Z direction. An insertion hole 22ha is provided on each of the fifth support portion 22A and the sixth support portion 22B. The fixing member 50 is inserted into the insertion hole 22ha.

The seventh support portion 22C and the eighth support portion 22D are provided at the second end portion 10e2 of the housing 10. The seventh support portion 22C is provided at an end portion of the second main wall 12 on the side in the −Y direction. The seventh support portion 22C is disposed at a position at which the seventh support portion 22C overlaps the third support portion 21C of the first housing member 21 when viewed from the Z direction. The eighth support portion 22D is provided at an end portion of the second main wall 12 on the side in the +Y direction. The eighth support portion 22D is disposed at a position at which the eighth support portion 22D overlaps the fourth support portion 21D of the first housing member 21 when viewed from the Z direction. The seventh support portion 22C and the eighth support portion 22D protrude from the second main wall 12 in the −Z direction. The insertion hole 22ha is provided on each of the seventh support portion 22C and the eighth support portion 22D. The fixing member 50 is inserted into the insertion hole 22ha.

The metal portion M2 is a metal portion included in the second housing member 22. The metal portion M2 forms a main part of the second housing member 22. The metal portion M2 is, for example, aluminum or an aluminum alloy. The metal portion M2 has electroconductivity. The metal portion M2 functions as ground of the semiconductor storage device 1.

The insulating layer I2 is an insulating layer included in the second housing member 22. The insulating layer I2 is provided on a surface of the metal portion M2. The insulating layer I2 is provided on, for example, both surfaces of the metal portion M2. Of the inner surface of the housing 10, the insulating layer I2 forms another part different from a part including the insulating layer I1. In the present application, "provided on the inner surface of the housing 10" may mean a case of "provided on the insulating layer I2".

The second conductive pad CP2 will be described below.

1.3 Board Unit

Figure 4:
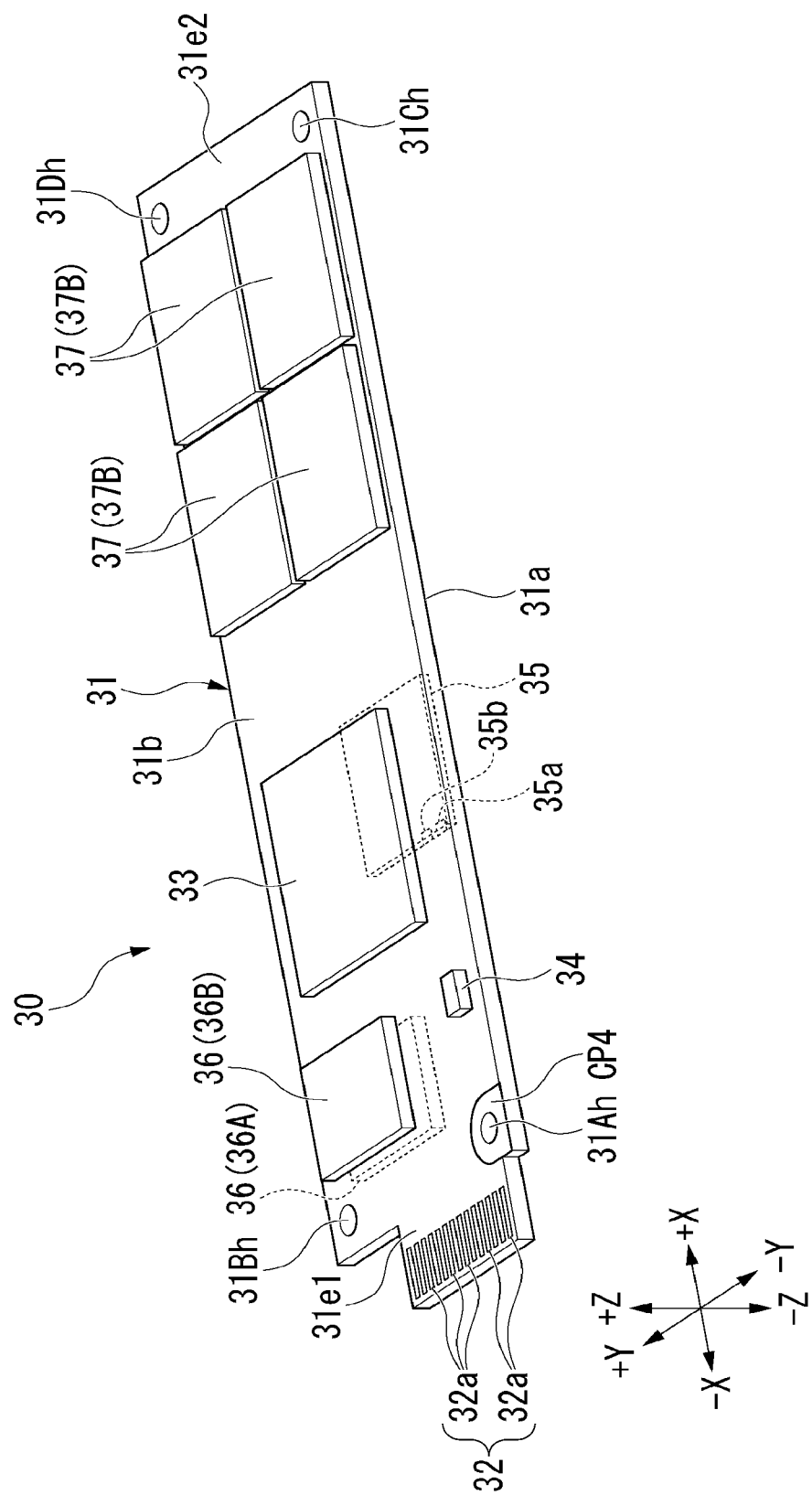
FIG. 4 is a perspective view showing a board unit according to the first embodiment.

Next, the board unit 30 housed in the housing 10 will be described. FIG. 4 is a perspective view showing the board unit 30. The board unit 30 is an assembly on which devices included in a circuit are mounted. The board unit 30 includes, for example, a board 31, an external connector 32, the controller 33, the power converter 34, the power supply circuit component 35, a plurality of DRAMs 36 (Dynamic Random Access Memory), and a plurality of memories 37. However, one DRAM 36 may be mounted on the board 31.

The board 31 is a printed-wiring board. The board 31 is an example of "first board". In the embodiment, a second board is not present, and the board 31 is an example of "first board". The shape of the board 31 is a plate. The shape of the board 31 is, for example, an elongated rectangular shape extending in the X direction. The board 31 includes an insulating base member and a wiring pattern provided on the insulating base member.

The external connector 32 is an electrical connection portion provided on the board 31. The external connector 32 is provided at a first end portion 31e1 of the board 31. The external connector 32 is exposed to the outside of the housing 10 (refer to FIG. 1). The external connector 32 includes a plurality of metal terminals 32a that align in the Y direction. The external connector 32 is connectable to a connector of the host device.

The controller 33 is a control component (control device) mounted on the board 31. The controller 33 is an example of "heat generator". The controller 33 is, for example, mounted on a second surface 31b of the board 31. The controller 33 totally controls the entire semiconductor storage device 1. The controller 33 is a device generating heat during operation. An amount of heat generation of the controller 33 is greater than the amount of heat generation of the power supply circuit component 35.

The power converter 34 is a device that carries out power conversion. The power converter 34 is, for example, a DC-DC converter. The power converter 34 is a device that generates heat during operation. The power converter 34 is an example of "heat generator". The power converter 34 is mounted on, for example, the second surface 31*b* of the board 31. The power converter 34 is configured to convert electrical power supplied from the host device into electrical power having a required voltage. The power converter 34 outputs the converted electrical power to the power supply circuit component 35.

The power supply circuit component 35 is a device that controls electrical power. The power supply circuit component 35 is, for example, a PMIC (Power Management IC). The power supply circuit component 35 is mounted on, for example, a first surface 31*a* of the board 31. The power supply circuit component 35 is configured to carry out power control of various devices (the controller 33, the DRAMs 36, the memories 37, or the like) which are included in the board unit 30. The power supply circuit component 35 includes an anode power supply 35*a* and a cathode power supply 35*b*. The anode power supply 35*a* is a power supply capable of supplying electrical power for charging to the capacitors 40 which will be described below. The cathode power supply 35*b* is a power supply that forms a pair of power supplies together with the anode power supply 35*a*.

The DRAMs 36 are each, for example, a semiconductor package that includes a volatile semiconductor memory chip. The DRAM 36 may be used as a data buffer that temporarily stores write data received from the host device, and read data read from one or more of the memories 37, or the like. The plurality of the DRAMs 36 are, for example, a first DRAM 36A and a second DRAM 36B. The first DRAM 36A is mounted on the first surface 31*a* of the board 31. The second DRAM 36B is mounted on the second surface 31*b* of the board 31.

The memories 37 are each, for example, a semiconductor package that includes a nonvolatile semiconductor memory chip. The memories 37 are each, for example, a NAND flash memory. The memories 37 may be each a NOR memory, an MRAM (Magnetoresistive Random Access Memory), or a ReRAM (Resistive Random Access Memory). The memories 37 are each a device generating heat during operation. The memories 37 are each an example of "heat generator". The plurality of the memories 37 are, for example, a plurality of first memories 37A and a plurality of second memories 37B. The plurality of the first memories 37A are mounted on the first surface 31*a* of the board 31. The plurality of the first memories 37A align in the X direction and the Y direction. The plurality of the second memories 37B are mounted on the second surface 31*b* of the board 31. The plurality of the second memories 37B align in the X direction and the Y direction.

Next, a specific configuration of each of various components of the board unit 30 will be described.

The board 31 includes the first surface 31*a*, the second surface 31*b*, the first end portion 31*e*1, a second end portion 31*e*2, a third conductive pad CP3, a wiring W3, a fourth conductive pad CP4, and a wiring W4. The first surface 31*a* is a surface directed to the −Z direction. The second surface 31*b* is a surface directed to the +Z direction.

The first end portion 31*e*1 and the second end portion 31*e*2 are each an end portion in the longitudinal direction (the X direction). The first end portion 31*e*1 is the end portion on the side in the −X direction. A part of the first end portion 31*e*1 passes through an opening 10*p* of the housing 10 on the side in the −X direction and protrudes from the opening 10*p* toward the outside of the housing 10 (refer to FIG. 1). The second end portion 31*e*2 is the end portion on the side in the +X direction. The second end portion 31*e*2 is located on the opposite side of the first end portion 31*e*1.

The first end portion 31*e*1 has a first insertion hole 31Ah and a second insertion hole 31Bh. The first insertion hole 31Ah and the second insertion hole 31Bh are each a hole that penetrates through the board 31 in the Z direction. The fixing member 50 passes through each of the first insertion hole 31Ah and the second insertion hole 31Bh. When viewed from the Z direction, the first insertion hole 31Ah is disposed at a position at which the first insertion hole 31Ah overlaps the fixation hole 21*ha* of the first support portion 21A of the first housing member 21. When viewed from the Z direction, the second insertion hole 31Bh is disposed at a position at which the second insertion hole 31Bh overlaps the fixation hole 21*ha* of the second support portion 21B of the first housing member 21.

The second end portion 31*e*2 has a third insertion hole 31Ch and a fourth insertion hole 31Dh. The third insertion hole 31Ch and the fourth insertion hole 31Dh are each a hole that penetrates through the board 31 in the Z direction. The fixing member 50 passes through each of the third insertion hole 31Ch and the fourth insertion hole 31Dh. When viewed from the Z direction, the third insertion hole 31Ch is disposed at a position at which the third insertion hole 31Ch overlaps the fixation hole 21*ha* of the third support portion 21C of the first housing member 21. When viewed from the Z direction, the fourth insertion hole 31Dh is disposed at a position at which the fourth insertion hole 31Dh overlaps the fixation hole 21*ha* of the fourth support portion 21D of the first housing member 21.

The third conductive pad CP3, the wiring W3, the fourth conductive pad CP4, and the wiring W4 will be described below.

Figure 5:
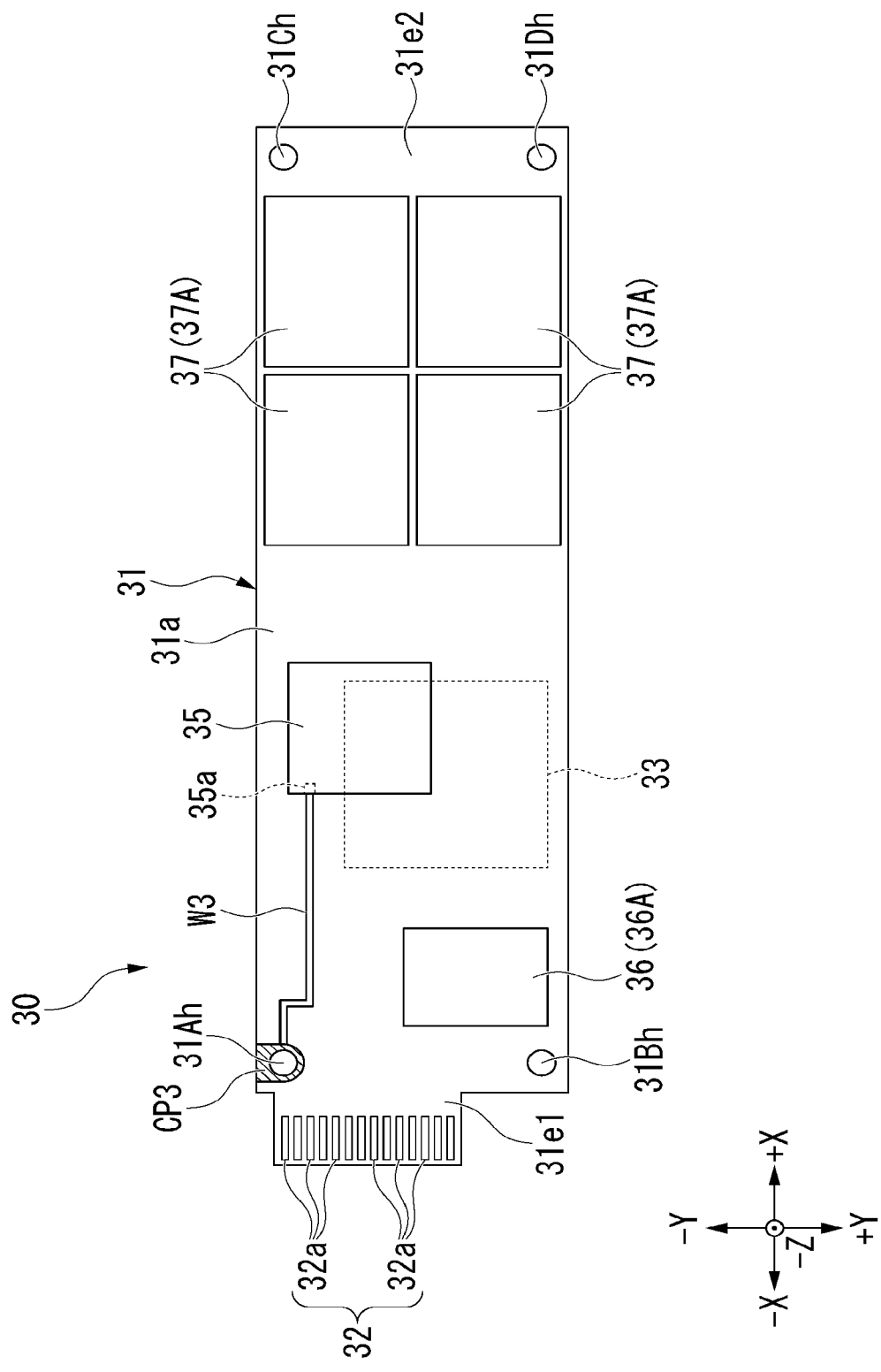
FIG. 5 is a bottom view showing the board unit according to the first embodiment.

FIG. 5 is a bottom view showing the board unit 30. In FIG. 5, for convenience of explanation, the third conductive pad CP3 is represented by hatching.

The third conductive pad CP3 is an electrical connection portion provided on the board 31. The third conductive pad CP3 is an example of "first electrode". The third conductive pad CP3 is provided on the first surface 31*a* of the board 31. The third conductive pad CP3 is exposed to the outside of the board 31. When viewed from the Z direction, the third conductive pad CP3 is disposed at a position at which the third conductive pad CP3 overlaps the first support portion 21A of the first housing member 21. The third conductive pad CP3 is provided around, for example, the insertion hole 31Ah. An insulating portion is provided between the third conductive pad CP3 and the insertion hole 31Ah.

Figure 6:
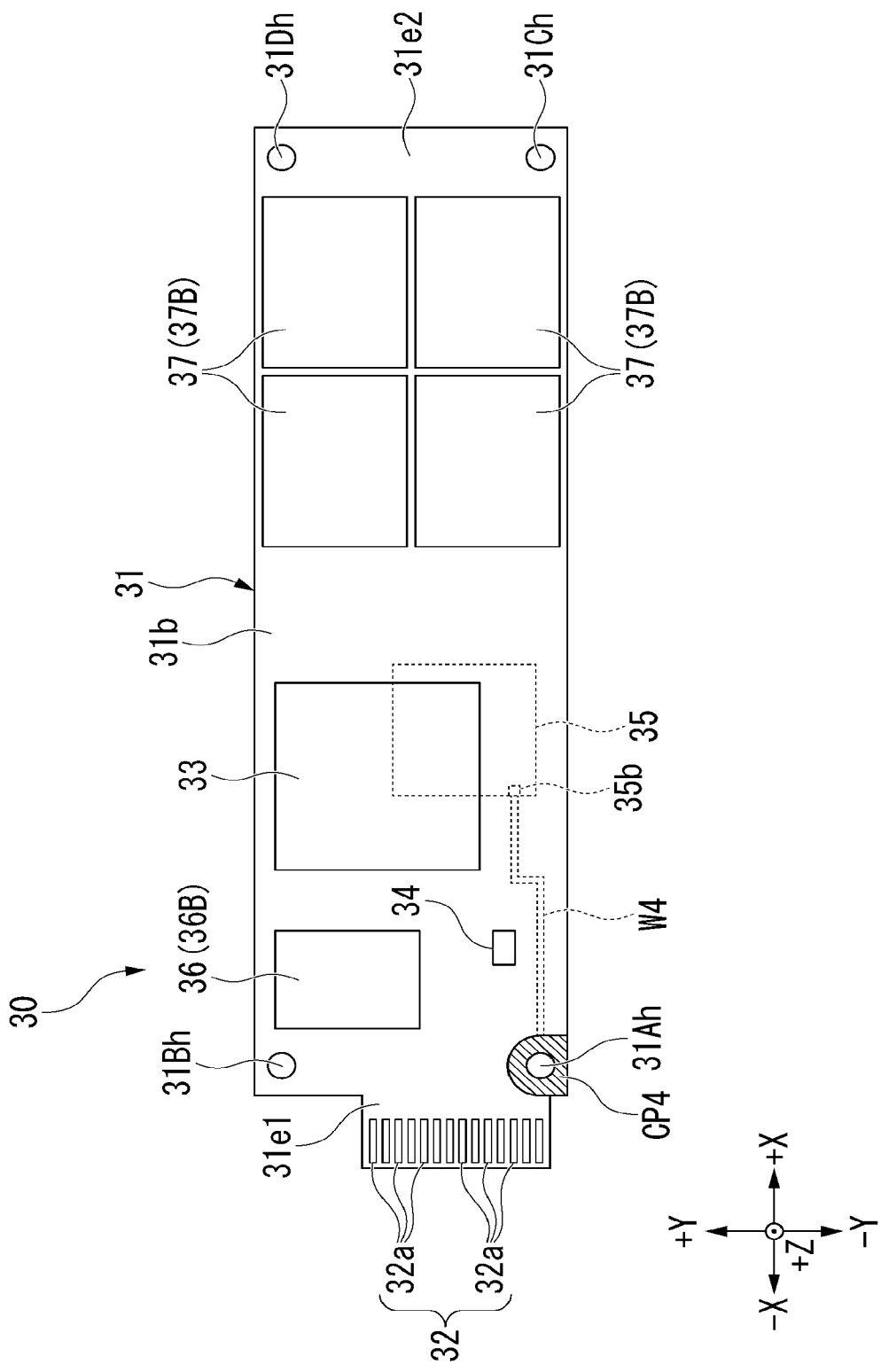
FIG. 6 is a plan view showing the board unit according to the first embodiment.

The wiring W3 is a wiring line provided on the board 31. The wiring W3 is provided between the anode power supply 35*a* of the power supply circuit component 35 and the third conductive pad CP3. The wiring W3 connects the anode power supply 35*a* of the power supply circuit component 35 and the third conductive pad CP3. FIG. 6 is a top view showing the board unit 30. In FIG. 6, for convenience of explanation, the fourth conductive pad CP4 is represented by hatching.

The fourth conductive pad CP4 is an electrical connection portion provided on the board 31. The fourth conductive pad CP4 is an example of "second electrode". The fourth conductive pad CP4 is provided on the second surface 31*b* of the board 31. The fourth conductive pad CP4 is exposed to the outside of the board 31. When viewed from the Z direction, the fourth conductive pad CP4 is disposed at a position at which the fourth conductive pad CP4 overlaps the fifth support portion 22A of the second housing member 22. The fourth conductive pad CP4 is provided around, for example, the insertion hole 31Ah.

The wiring W4 is a wiring line provided on the board 31. The wiring W4 is provided between the fourth conductive pad CP4 and the cathode power supply 35b of the power supply circuit component 35. The wiring W4 connects the fourth conductive pad CP4 and the cathode power supply 35b of the power supply circuit component 35. The wiring W3 connected to the third conductive pad CP3 and the wiring W4 connected to the fourth conductive pad CP4 are wiring lines that are electrically independent from each other. The wiring W3 and the wiring W4 are each individually connected to the power supply circuit component 35.

1.4 Fixing Member 50

Here, the fixing member 50 will be described. The fixing member 50 is, for example, a metal screw. The plurality of the fixing members 50 are a first fixing member 50A, a second fixing member 50B, a third fixing member 50C, and a fourth fixing member 50D (refer to FIG. 2). The first fixing member 50A passes through the insertion hole 22ha of the fifth support portion 22A of the second housing member 22, thereafter passes through the first insertion hole 31Ah of the board 31, and is engaged with the fixation hole 21ha of the first support portion 21A of the first housing member 21. The second fixing member 50B passes through the insertion hole 22ha of the sixth support portion 22B of the second housing member 22, thereafter passes through the second insertion hole 31Bh of the board 31, and is engaged with the fixation hole 21ha of the second support portion 21B of the first housing member 21. The third fixing member 50C passes through the insertion hole 22ha of the seventh support portion 22C of the second housing member 22, thereafter passes through the third insertion hole 31Ch of the board 31, and is engaged with the fixation hole 21ha of the third support portion 21C of the first housing member 21. The fourth fixing member 50D passes through the insertion hole 22ha of the eighth support portion 22D of the second housing member 22, thereafter passes through the fourth insertion hole 31Dh of the board 31, and is engaged with the fixation hole 21ha of the fourth support portion 21D of the first housing member 21. Accordingly, the first housing member 21 and the second housing member 22 of the housing 10 are fixed to each other. As a result, the board 31 is fixed to the inside of housing 10.

1.5 Capacitor

1.5.1 Function of Capacitor

Figure 7:
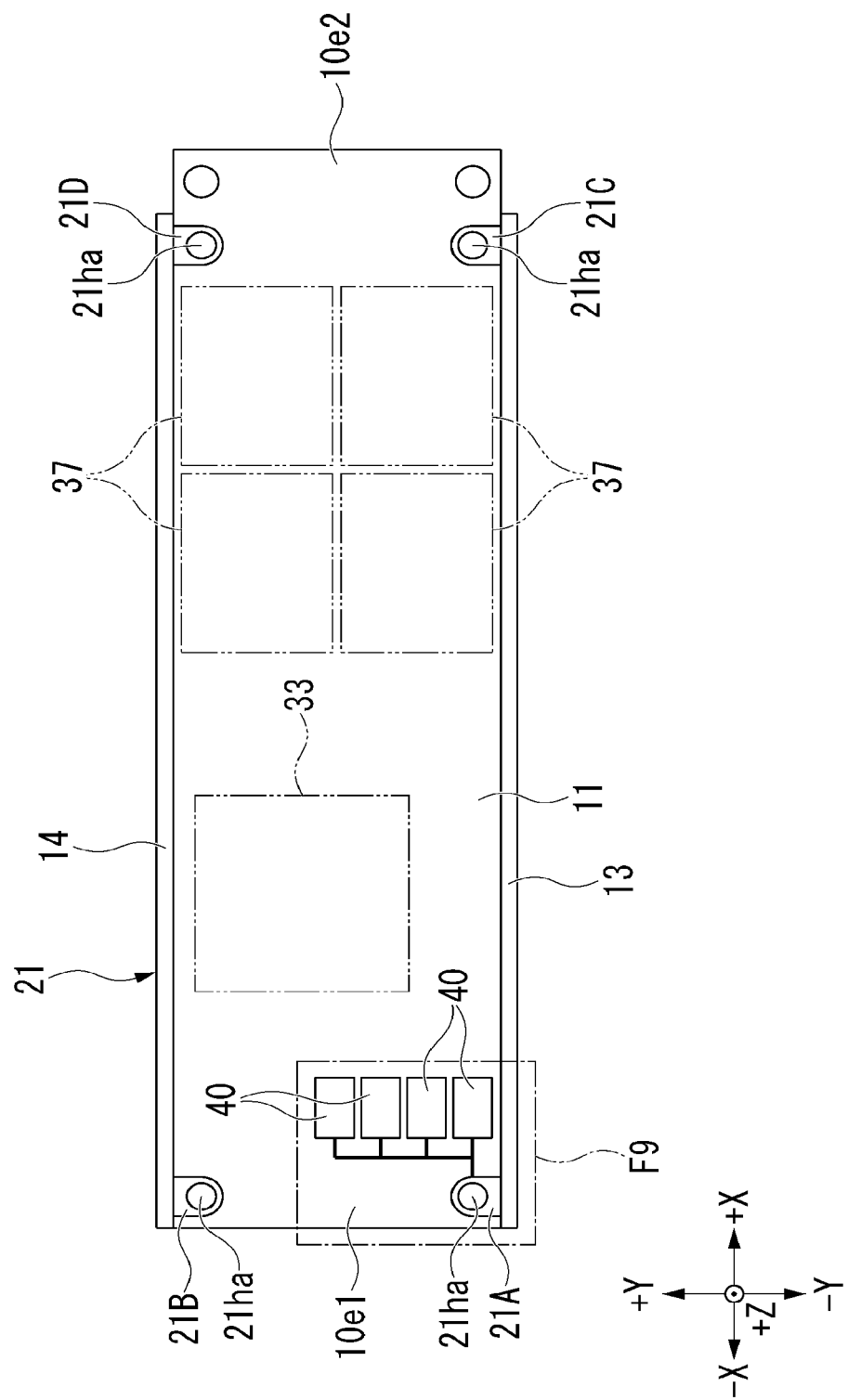
FIG. 7 is a plan view showing a first housing member and a capacitor according to the first embodiment.

Next, the function of the capacitor 40 will be described. FIG. 7 is a plan view showing the first housing member 21 and the capacitors 40.

The capacitors 40 are each a component configured to store electric charge and discharge the stored electric charge. The capacitor 40 is, for example, an electric double layer capacitor. The capacitor 40 has a function of Electrical Power Loss Protection (PLP) for data protection when shut-off of electrical power unexpectedly happens. For example, when power supply from the host device to the semiconductor storage device 1 is unexpectedly shut off, the capacitor 40 supplies electrical power to the controller 33, the plurality of the DRAMs 36, and the plurality of the memories 37, or the like for a predetermined time. For example, until the write data that was temporarily stored in the DRAMs 36 is read out from the DRAMs 36 and transferring of the write data to the memories 37 is completed, the capacitors 40 supply electrical power to the controller 33, the DRAMs 36, and the memories 37, or the like. Consequently, even when power supply is unexpectedly shut off, disappearance of data is suppressed.

1.5.2 Arrangement of Capacitor

Next, the arrangement of the capacitors 40 will be described. The plurality of the capacitors 40 align in the Y direction on an inner surface of the first main wall 11 of the first housing member 21. The capacitors 40 are arranged closer to the first end portion 10e1 of the housing 10 than the second end portion 10e2 of the housing 10 in the X direction. Particularly, in the X direction, the capacitors 40 are arranged on a region opposite to the plurality of the memories 37 serving as a heat generator.

Next, the arrangement of the capacitors 40 will be further described. FIG. 7 is a cross-sectional view showing the semiconductor storage device 1 shown in FIG. 1 when viewed from the Z-direction. The capacitors 40 are provided on the inner surface of the housing 10. The "inner surface" is a surface exposed to an internal space of the housing 10. The internal space of the housing 10 is a space that accommodates the board unit 30 therein. The capacitors 40 are separated from the board 31. The capacitors 40 are spaced apart at a distance in the Z direction from the board 31 and faces the board 31. The capacitors 40 are fixed to, for example, the inner surface of the first main wall 11 of the housing 10. The length of the capacitor 40 in the Z direction is smaller than the length of the first support portion 21A in the Z direction.

Figure 8:
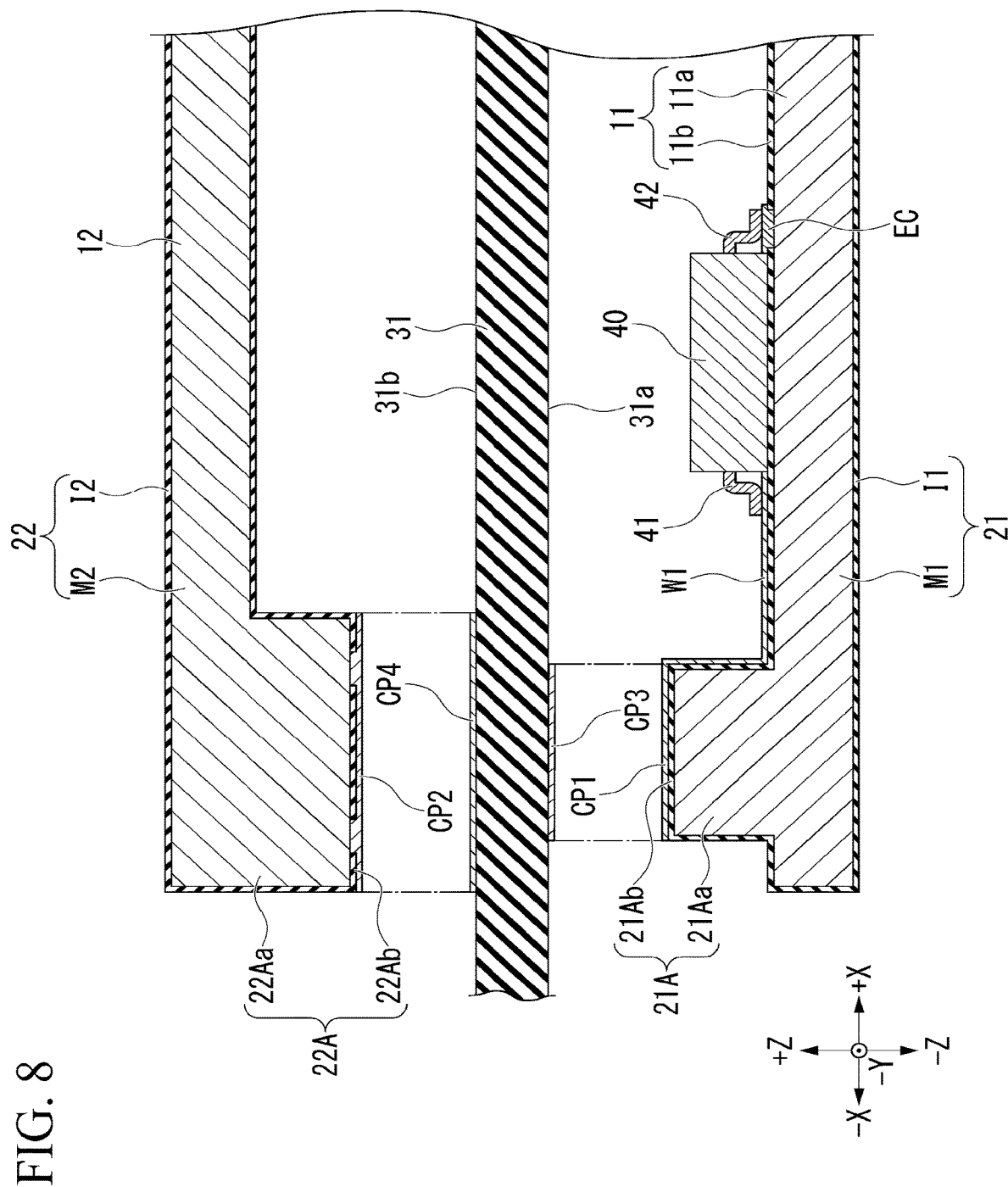
FIG. 8 is a partially exploded cross-sectional view showing a region surrounded by line F8 shown in FIG. 2.

Next, an electrical connection configuration related to the capacitors 40 will be described. FIG. 8 is a cross-sectional exploded view showing a region surrounded by line F8 of the semiconductor storage device 1 shown in FIG. 2. The electrical connection configuration is, for example, an electrical connection portion that electrically connects a plurality of components to each other. The electrical connection configuration is, for example, an electrical connection portion that electrically connects the board unit 30 and the capacitors 40. At least part of the electrical connection configuration is provided in the housing 10. Note that, a part of the electrical connection configuration may be configured by the housing 10.

(First Support Portion)

The first support portion 21A includes a body part 21Aa and an insulating layer 21Ab. The body part 21Aa forms most of the first support portion 21A. The body part 21Aa is a part of the metal portion M1 of the first housing member 21. The insulating layer 21Ab is provided on a surface of the body part 21Aa. The insulating layer 21Ab is a part of the insulating layer I1 of the first housing member 21.

(First Conductive Pad)

The first conductive pad CP1 is a conductor for connection. The first conductive pad CP1 is provided on an end face of the first support portion 21A on the side in the +Z direction. The first conductive pad CP1 is provided on the insulating layer 21Ab of the first support portion 21A. The first conductive pad CP1 is spaced apart from the body part 21Aa of the first support portion 21A. The first conductive pad CP1 is formed by, for example, deposition or plating using a metal, or by attachment of a metal foil. The first conductive pad CP1 faces the third conductive pad CP3 of the board 31 in the Z direction. The first conductive pad CP1 is connected to the third conductive pad CP3 by being in contact with the third conductive pad CP3.

Figure 9:
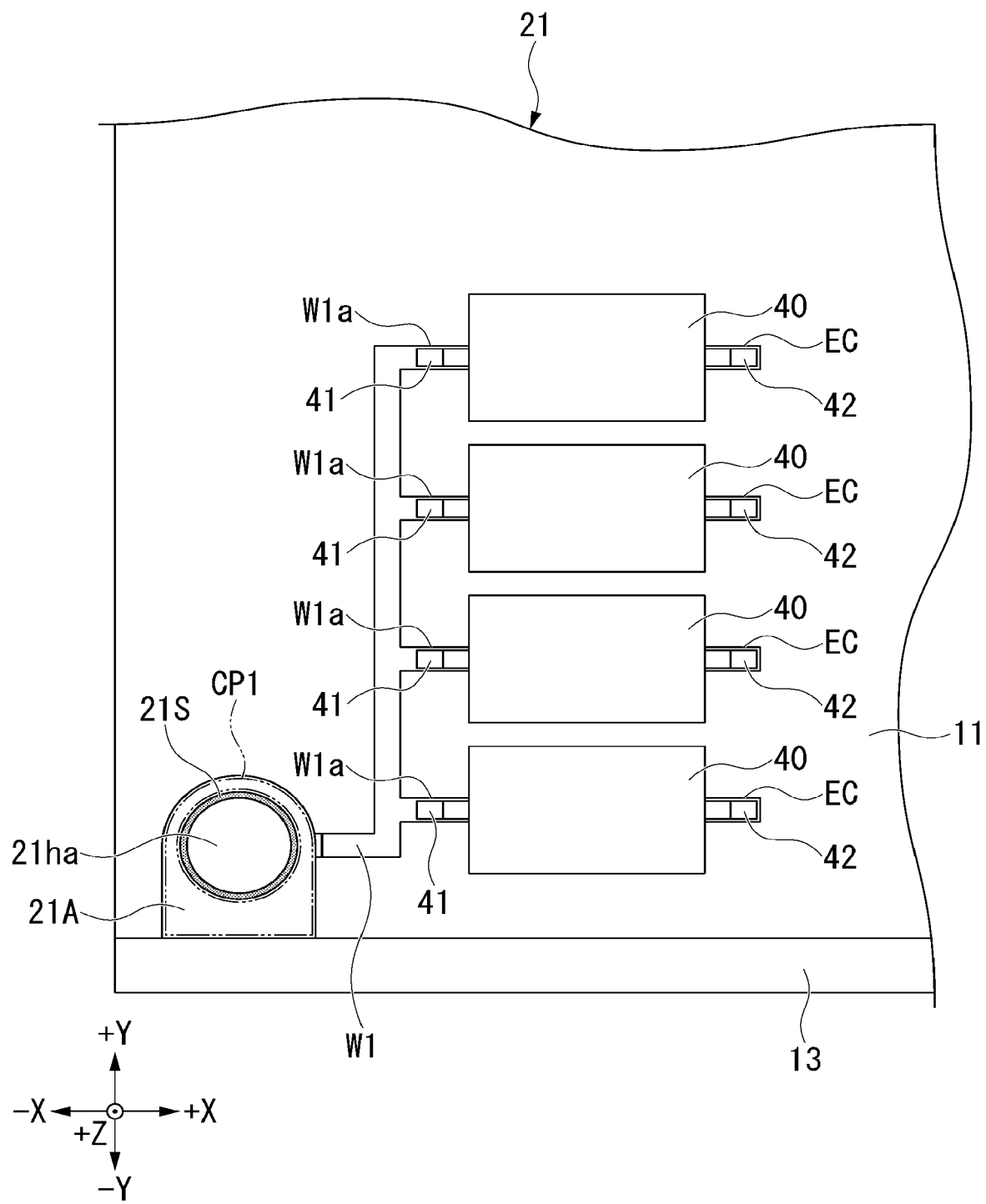
FIG. 9 is a plan view showing a region surrounded by line F9 shown in FIG. 7.

FIG. 9 is a plan view showing a region surrounded by line F9 shown in FIG. 7. When viewed from the Z direction, the outer shape of the first conductive pad CP1 is the same as the outer shape of the first support portion 21A. The first conductive pad CP1 is provided around the fixation hole 21ha of the first support portion 21A. An insulating portion 21S (insulation-processed portion) is provided between the first conductive pad CP1 and the fixation hole 21ha. The shape of the insulating portion 21S is a circular ring shape that surrounds the fixation hole 21ha. The insulating portion 21S is formed by treatment of providing a mask thereon before forming the first conductive pad CP1 on a region to be the insulating portion 21S. Instead of this treatment, the insulating portion 21S may be formed by treatment of, for example, removing the end portion of the first conductive pad CP1 adjacent to the fixation hole 21ha after the first conductive pad CP1 is formed. The insulating portion 21S ensures insulation between the first conductive pad CP1 and the fixing member 50 inserted into the fixation hole 21ha.

(Wiring)

Next, the wiring W1 will be particularly described with reference to FIG. 8. The wiring W1 is a wiring line provided on the housing 10. The wiring W1 is formed by, for example, deposition or plating using a metal. The wiring W1 is provided on and along both a side surface of the first support portion 21A and the inner surface of the first main wall 11. One end of the wiring W1 is connected to the first conductive pad CP1. Therefore, the wiring W1 is connected to the third conductive pad CP3 of the board 31 via the first conductive pad CP1. The other end of the wiring W1 is located close to the capacitors 40 on the inner surface of the first main wall 11.

Additionally, the wiring W1 is provided on both the insulating layer 21Ab of the first support portion 21A and the insulating layer 11b of the first main wall 11. The wiring W1 is spaced apart from the body part 21Aa of the first support portion 21A and the body part 11a of the first main wall 11. The wiring W1 has, for example, a plurality of branch portions W1a on the inner surface of the first main wall 11, and the branch portions W1a are branched from the wiring W1 extending in the X direction (refer to FIG. 9). The branch portions W1a correspond one-to-one to the capacitors 40. The branch portions W1a align in the X direction in which the capacitors 40 align. Each of the branch portions W1a extends from the wiring W1 to a position near the corresponding capacitor 40.

(Electrical Connection Portion)

Next, the electrical connection portion EC will be particularly described with reference to FIG. 8. The electrical connection portion EC is an electrical connection portion for ground provided on the housing 10. The electrical connection portion EC is formed by, for example, deposition or plating using a metal in a way similar to the case of forming the first conductive pad CP1. The electrical connection portion EC is formed by removing a part of the insulating layer 11b of the first main wall 11 and by providing a metal member on the removed portion. The electrical connection portion EC is provided at the opposite side of the wiring W1 with respect to the capacitor 40. The electrical connection portion EC is connected to the body part 11a of the first main wall 11. An electrical potential of the electrical connection portion EC is ground potential. The electrical connection portions EC are provided so as to correspond one-to-one to the plurality of the capacitors 40 (refer to FIG. 9).

(Capacitor)

Next, the capacitor 40 will be particularly described with reference to FIG. 8. The capacitor 40 includes a first terminal 41 and a second terminal 42.

The first terminal 41 is an anode of the capacitor 40. The first terminal 41 is connected to the wiring W1 on the inner surface of the first main wall 11. For example, the first terminal 41 is fixed to the wiring W1 via solder. In the embodiment, the first terminals 41 of the plurality of the capacitors 40 are fixed to the plurality of the branch portions W1a of the wiring W1 in one-to-one correspondence (refer to FIG. 9). Accordingly, the first terminals 41 of the plurality of the capacitors 40 are electrically connected in parallel to the wiring W1. Each of the first terminals 41 of the capacitors 40 is connected to the third conductive pad CP3 of the board 31 via the wiring W1 and the first conductive pad CP1.

The second terminal 42 is a cathode of the capacitor 40. The second terminal 42 is connected to the electrical connection portion EC on the inner surface of the first main wall 11. For example, the second terminal 42 is fixed to the electrical connection portion EC via solder. In the embodiment, the second terminals 42 of the plurality of the capacitors 40 are fixed to the electrical connection portions EC in one-to-one correspondence (refer to FIG. 9). Each of the second terminals 42 of the capacitors 40 is connected to the body part 11a of the first main wall 11 (i.e., the metal portion M1 of the first housing member 21) via the electrical connection portion EC.

(Fifth Support Portion)

Next, the fifth support portion 22A will be particularly described with reference to FIG. 8. The fifth support portion 22A includes a body part 22Aa and an insulating layer 22Ab. The body part 22Aa forms most of the fifth support portion 22A. The body part 22Aa is a part of the aforementioned metal portion M2. The insulating layer 22Ab is provided on a surface of the body part 22Aa. The insulating layer 22Ab is a part of the aforementioned insulating layer I2.

(Second Conductive Pad)

Next, the second conductive pad CP2 will be particularly described with reference to FIG. 8. The second conductive pad CP2 is a conductor for connection. The second conductive pad CP2 is formed by, for example, deposition or plating using a metal, or by attachment of a metal foil. The second conductive pad CP2 is provided on an end face of the fifth support portion 22A on the side in the −Z direction. The second conductive pad CP2 is provided on the insulating layer 22Ab of the fifth support portion 22A. The second conductive pad CP2 faces the fourth conductive pad CP4 of the board 31 in the Z direction. The second conductive pad CP2 is connected to the fourth conductive pad CP4 by being in contact with the fourth conductive pad CP4. In the embodiment, a part of the insulating layer 22Ab of the fifth support portion 22A is removed, and a part of the second conductive pad CP2 is implanted into the removed portion. Because of this, the second conductive pad CP2 is connected to the body part 22Aa of the fifth support portion 22A. When viewed from the Z direction, the outer shape of the second conductive pad CP2 is the same as the outer shape of the fifth support portion 22A. The second conductive pad CP2 is provided around the insertion hole 22ha of the fifth support portion 22A. An insulating portion may be provided or may not be provided between the second conductive pad CP2 and the insertion hole 22ha.

Figure 10:
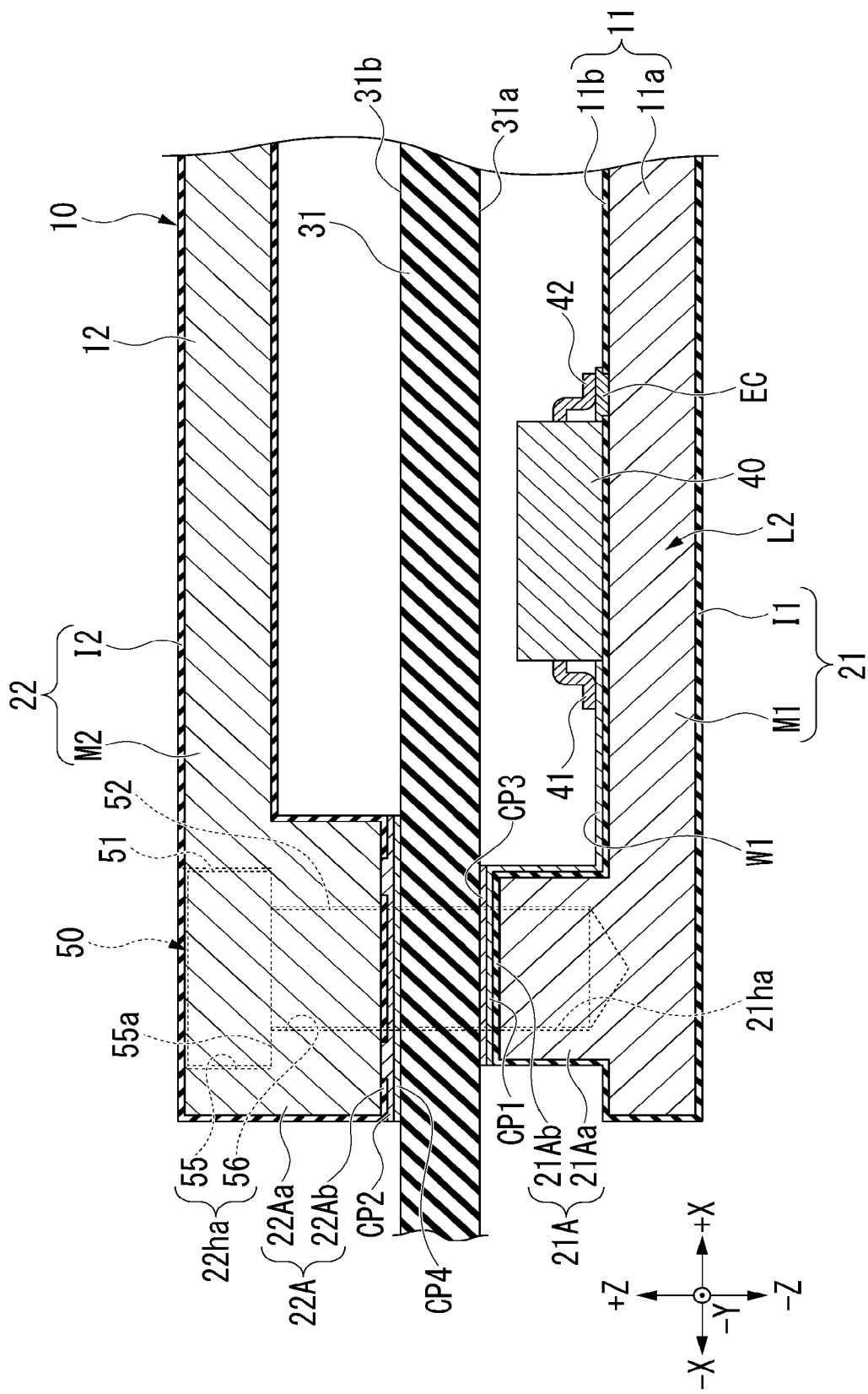
FIG. 10 is a cross-sectional view showing a post-assembled state of a structure shown in FIG. 8.

Next, an electrical connection portion that connects the power supply circuit component 35 of the board unit 30 and the capacitors 40 will be particularly described with reference to FIG. 10. FIG. 10 is a cross-sectional view showing a post-assembled state of the structure shown in FIG. 8. When the first housing member 21 is fixed to the second housing member 22 by the fixing member 50, an anode connection line L1 including the wiring W3 of the board 31, the third conductive pad CP3, the first conductive pad CP1, and the wiring W1 is formed. Moreover, when the first housing member 21 is fixed to the second housing member 22 by the fixing member 50, a cathode connection line L2 (ground wiring) including the second terminal 42 of the capacitor 40, the electrical connection portion EC, the metal portion M1 of the first housing member 21, the fixing member 50, the metal portion M2 of the second housing member 22, the second conductive pad CP2, the fourth conductive pad CP4, and the wiring W4 of the board 31 is formed. In the above description, electrical connections between the wiring W3 of the board 31 and the third conductive pad CP3, between the first conductive pad CP1 and the wiring W1, between the second terminal 42 of the capacitor 40 and the electrical connection portion EC, and between the fourth conductive pad CP4 and the wiring W4 of the board 31 were explained.

As the first housing member 21 and the second housing member 22 are coupled to each other by the fixing member 50 in a state of sandwiching the board 31 therebetween, the first conductive pad CP1 of the first housing member 21 and the third conductive pad CP3 of the board 31 are pressed against each other in a state of being in contact with each other. Similarly, the second conductive pad CP2 of the second housing member 22 and the fourth conductive pad CP4 of the board 31 are pressed against each other in a state of being in contact with each other. Consequently, the first conductive pad CP1 of the first housing member 21 is electrically and tightly connected to the third conductive pad CP3 of the board 31. Additionally, the second conductive pad CP2 of the second housing member 22 is electrically and tightly connected to the fourth conductive pad CP4 of the board 31.

As the first housing member 21 and the second housing member 22 are coupled to each other by the fixing member 50 in a state of sandwiching the board 31 therebetween, the fixing member 50 is electrically connected to the metal portion M1 of the first housing member 21.

Here, the insulating layer 21Ab is not provided on an inner peripheral face of the fixation hole 21ha of the first support portion 21A of the first housing member 21. The body part 21Aa made of a metal is exposed to the inner peripheral face of the fixation hole 21ha.

Furthermore, the fixing member 50 includes a head portion 51 and an axis portion 52. The axis portion 52 is thinner than the head portion 51. A screw thread is provided on the axis portion 52.

Consequently, as the axis portion 52 is engaged with the fixation hole 21ha, the fixing member 50 is electrically connected to the body part 21Aa of the first support portion 21A (i.e., the metal portion M1 of the first housing member 21).

As the first housing member 21 and the second housing member 22 are coupled to each other by the fixing member 50 in a state of sandwiching the board 31 therebetween, the fixing member 50 is electrically connected to the metal portion M2 of the second housing member 22.

Here, the insertion hole 22ha of the second housing member 22 includes a first portion 55 and a second portion 56. The first portion 55 is a hole into which the head portion 51 of the fixing member 50 is to be inserted. The second portion 56 is a hole into which the axis portion 52 of the fixing member 50 is to be inserted.

The first portion 55 of the insertion hole 22ha includes a bottom portion 55a. The bottom portion 55a is a stepped portion that is present at a boundary between the first portion 55 and the second portion 56. That is, the bottom portion 55a is a stepped portion formed because of a difference in diameter between the first portion 55 and the second portion 56. The bottom portion 55a faces the head portion 51 of the fixing member 50 in the Z direction. The insulating layer I2 is not provided on the bottom portion 55a. The metal portion M2 of the second housing member 22 is exposed to the bottom portion 55a.

Consequently, as the axis portion 52 of the fixing member 50 is inserted into the fixation hole 21ha in a state in which the head portion 51 of the fixing member 50 faces the bottom portion 55a of the insertion hole 22ha, the fixing member 50 is electrically connected to the metal portion M2 of the second housing member 22.

1.6 Function

Figure 11:
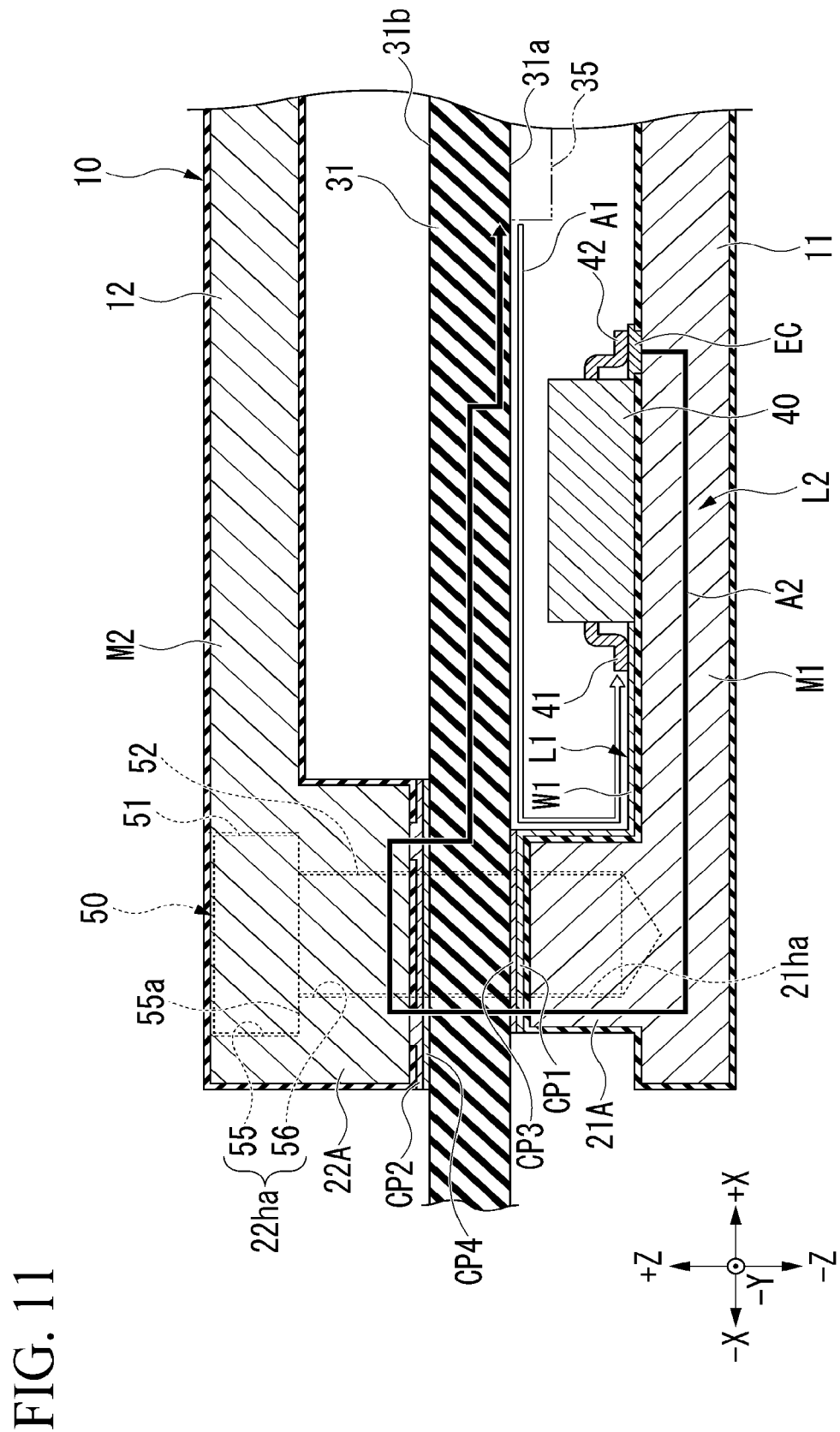
FIG. 11 is a cross-sectional explanatory view of a function of the semiconductor storage device according to the first embodiment.

Next, a function of the semiconductor storage device 1 will be described. FIG. 11 is a cross-sectional explanatory view of a function of the semiconductor storage device 1. In FIG. 11, a direction of movement of electric charge on the anode connection line L1 during normal operation (during normally supplying electrical power from the host device to the semiconductor storage device 1) is shown by a white arrow A1. In addition, in FIG. 11, a direction of movement of electric charge on the cathode connection line L2 during the normal operation is shown by a black arrow A2.

1.6.1 Normal Operation

During the normal operation, electrical power is supplied from the host device, via the external connector 32 and the power converter 34 to the power supply circuit component 35. Part of the electrical power supplied from the power supply circuit component 35 is supplied from the power supply circuit component 35 to various devices (for example, the controller 33, the DRAMs 36, and the memories 37) which are included in the board unit 30 under electrical power control of the power supply circuit component 35.

The anode connection line L1 including the wiring W3 of the board 31, the third conductive pad CP3, the first conductive pad CP1, and the wiring W1 is formed between the anode power supply 35a of the power supply circuit component 35 and the first terminal 41 of the capacitor 40. In contrast, the cathode connection line L2 including the electrical connection portion EC, the metal portion M1 of the first housing member 21, the fixing member 50, the metal portion M2 of the second housing member 22, the second conductive pad CP2, the fourth conductive pad CP4, and the wiring W4 of the board 31 is formed between the second terminal 42 of the capacitor 40 and the cathode power supply 35b of the power supply circuit component 35. Consequently, until the capacitors 40 are fully charged up, an electrical current returning to the power supply circuit component 35 flows from the power supply circuit component 35 via the anode connection line L1, the capacitors 40, and the cathode connection line L2, and the capacitors 40 are charged up.

1.6.2 Happening of Unexpected Shut-Off of Electrical Power

When power supply from the host device to the semiconductor storage device 1 is unexpectedly shut off, the electrical power charged by the capacitors 40 is supplied from the capacitors 40 to the power supply circuit component 35 via the anode connection line L1. The power supply circuit component 35 supplies the electrical power supplied from the capacitors 40 to various devices (for example, the controller 33, the DRAMs 36, and the memories 37) which are included in the board unit 30. Accordingly, a PLP function is achieved by the capacitors 40.

1.7 Advantage

In the embodiment, the capacitors 40 are fixed to the housing 10 and are electrically connected to the board 31. With this configuration, there are at least one or more advantages of (1) to (4) described below.

(1) It is possible to achieve manufacturability of the semiconductor storage device 1. In a common manufacture of semiconductor storage devices, a process of mounting capacitors on a board is necessary in addition to a process of mounting a device such as a controller, a memory, or the like on a board. As a result, the number of processes necessary for manufacture of a board unit increases. In contrast, as shown in the embodiment, when the capacitors 40 are mounted on the housing 10, it is possible to separately carry out the process of mounting the devices such as the controller, the memory, or the like on the board and the process of mounting the capacitors on the housing (for example, the processes can be carried out in parallel). Accordingly, it is possible to achieve manufacturability of the semiconductor storage device 1.

(2) It is possible to suppress degradation of the capacitors 40. In a common semiconductor storage device, a heat generator such as a controller, a power converter, a memory, or the like and capacitors are mounted on one board. Subsequently, some of heat generated from the heat generator is transferred to the capacitors 40 via a board. Therefore, temperatures of the capacitors 40 increase, and the capacitors 40 are likely to be degraded.

In contrast, when the capacitors 40 are mounted on the housing 10, heat generated from the heat generator is less easily transferred to the capacitors 40 as compared to a case in which the capacitors 40 are mounted on the board 31. As a result, an increase in temperatures of the capacitors 40 is suppressed. Accordingly, it is possible to suppress degradation of the capacitors 40.

(3) It is possible to achieve improvement in capability of the semiconductor storage device 1. In recent years, a capacity of a semiconductor storage device has been rapidly increasing. Consequently, there is a tendency that an amount of data to be saved using the PLP function also increases, and accordingly, there is a possibility that the number of the capacitors 40 increases.

However, since the size of the board 31 is defined by the standard, the number or the size of components or devices to be disposed on the board 31 is limited. For this reason, in order to achieve improvement in capability of a semiconductor storage device 1 in the future, it is necessary to save the limited area of the board 31 and to effectively utilize the area.

In the embodiment, since the capacitors 40 are mounted on the housing 10, it is possible to reduce or omit an area of the board 31 for the capacitors 40. As a result, it is possible to effectively utilize the limited area of the board 31. For example, by increasing the number of the memories 37 to be mounted on the board 31, a memory capacity of the semiconductor storage device 1 can increase.

(4) It is easy to remove the capacitors 40. For example, in order to analyze a failure, it may be necessary to remove a component or a device which was mounted on the board 31 (rework) after the failure occurred. In the embodiment, since the capacitors 40 are fixed to the housing 10, the capacitors 40 can be easily separated from the board 31 as compared to a case in which the capacitors 40 are mounted on the board 31. Accordingly, it is possible to increase a degree of workability of rework.

In the embodiment, the housing 10 includes the wiring W1 provided on the inner surface of the housing 10. The capacitors 40 are connected to the board 31 via the wiring W1. With this configuration, electrical connection between the board 31 and the capacitors 40 can be carried out with space-saving as compared to a case in which, for example, the board 31 is connected to the capacitors 40 by use of a cable serving as another member. Accordingly, it is possible to provide a configuration contributing to downsizing, thinning, and high-density packaging of the semiconductor storage device 1.

In the embodiment, the housing 10 includes the first conductive pad CP1 facing the board 31. The wiring W1 is connected to the board 31 via the first conductive pad CP1. With this configuration, even when displacement between the board 31 and the housing 10 in the X direction or the Y direction occurs because of component tolerance, it is possible to further ensure the electrical connection between the board 31 and the capacitors 40.

In the embodiment, the housing 10 includes the first main wall 11 and the first support portion 21A. The first support portion 21A protrudes from the first main wall 11 in the thickness direction of the board 31. The first support portion 21A supports the board 31. The first conductive pad CP1 is provided on the first support portion 21A. With this configuration, as compared to a case of providing a special protruding portion on which the first conductive pad CP1 is to be provided, it is possible to provide a configuration contributing to downsizing, thinning, and high-density packaging of the semiconductor storage device 1.

In the embodiment, the first support portion 21A has the fixation hole 21*ha* into which the fixing member 50 is inserted. The first conductive pad CP1 is provided around the fixation hole 21*ha*. With this configuration, even when the first support portion 21A has the fixation hole 21*ha*, it is possible to ensure a relatively wider area to be used as the first conductive pad CP1. Consequently, it is possible to further ensure the electrical connection between the board 31 and the capacitors 40.

In the embodiment, the first support portion 21A includes the insulating portion 21S between the first conductive pad CP1 and the fixation hole 21*ha*. With this configuration, even when the fixing member 50 is made of a metal, it is possible to prevent short-circuiting between the fixing member 50 and the first conductive pad CP1.

In the embodiment, the first housing member 21 includes the metal portion M1. The second terminals 42 of the capacitors 40 are connected to the metal portion M1 of the first housing member 21. With this configuration, at least a part of the cathode connection line L2 is formed using the metal portion M1 of the first housing member 21. With this configuration, the electrical connection between the board 31 and the capacitors 40 can be carried out with space-saving as compared to a configuration not utilizing the metal portion M1 of the first housing member 21. Accordingly, it is possible to provide a configuration contributing to downsizing, thinning, and high-density packaging of the semiconductor storage device 1.

In the embodiment, the board 31 includes the third conductive pad CP3 and the fourth conductive pad CP4. The third conductive pad CP3 is provided on the first surface 31$a$ of the board 31. The third conductive pad CP3 is connected to the first terminals 41 of the capacitors 40 via the wiring W1 of the housing 10. The fourth conductive pad CP4 is provided on the second surface 31$b$ of the board 31. The fourth conductive pad CP4 is connected to the second terminals 42 of the capacitors 40 via the metal portion M1 of the first housing member 21. With this configuration, it is possible to form a part of the anode connection line L1 and a part of the cathode connection line L2 using the upper side and the under side of the board 31. Because of this, it is possible to provide a configuration contributing to downsizing, thinning, and high-density packaging of the semiconductor storage device 1 as compared to a case of additionally providing a special member component.

In the embodiment, the capacitors 40 are provided in a height range H of the first support portion 21A in the Z direction. In other words, the capacitors 40 are located between the insulating layer 11$b$ and the insulating layer 21Ab in the Z direction. With this configuration, even when the capacitors 40 are fixed to the housing 10, it is possible to prevent the semiconductor storage device 1 from being thick. Accordingly, it is possible to provide a configuration contributing to thinning of the semiconductor storage device 1.

In the embodiment, the plurality of the memories 37 serving as a heat generator are located closer to the second end portion 10$e2$ of the housing 10 than the first end portion 10$e1$ of the housing 10 in the X direction. In contrast, the plurality of the capacitors 40 are arranged closer to the first end portion 10$e1$ of the housing 10 than the second end portion 10$e2$ of the housing 10 in the X direction. That is, in the X direction, the capacitors 40 are arranged on a region opposite to the plurality of the memories 37 serving as a heat generator. Therefore, heat generated from the memories 37 is less easily transmitted to the capacitors 40 as compared to a case in which the capacitors 40 are arranged close to the second end portion 10$e2$ of the housing 10.

In the embodiment, the controller 33 and the power converter 34 which serve as a heat generator are connected to the second main wall 12 of the second housing member 22 via the thermal conductive member TM. In contrast, the plurality of the capacitors 40 are fixed to the first main wall 11 of the first housing member 21. Accordingly, as compared to a case in which the capacitors 40 are fixed to the second main wall 12, heat generated from the controller 33 and the power converter 34 is less easily transmitted to the capacitors 40.

1.8 Modified Example

Next, some modified examples according to the first embodiment will be described. Note that, configurations of each modified example other than those described below are the same as the configurations according to the first embodiment.

1.8.1 First Modified Example

Figure 12:
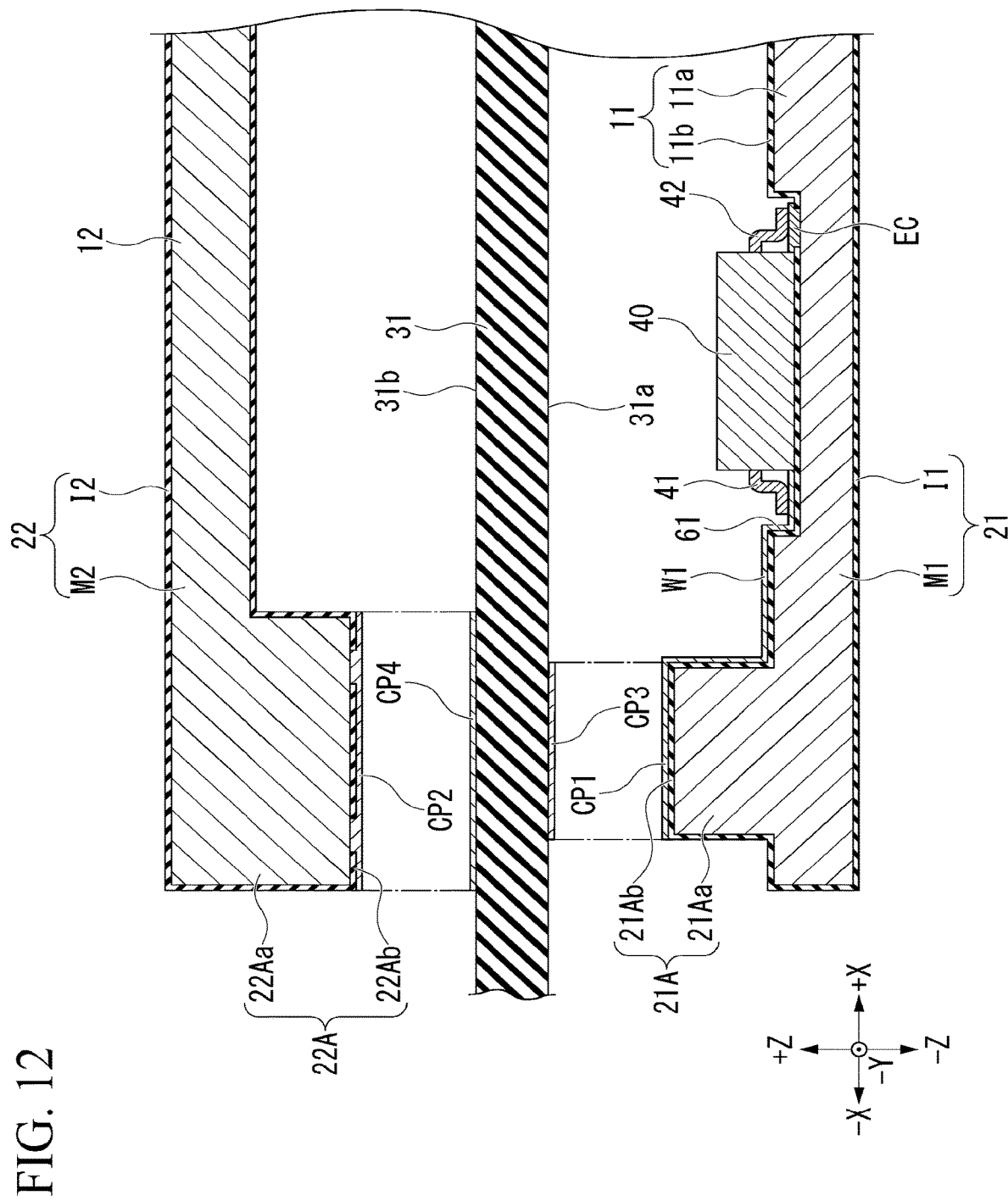
FIG. 12 is a partially exploded cross-sectional view showing a semiconductor storage device of a first modified example according to the first embodiment.

FIG. 12 is a partially exploded cross-sectional view showing a semiconductor storage device 1 according to a first modified example. In the modified example, the first main wall 11 has a recess 61. The recess 61 is a recess provided on the housing 10. The recess 61 is provided at a region corresponding to the capacitors 40. In the Z direction, the recess 61 is depressed in a direction away from the board 31 (the −Z direction).

Figure 13:
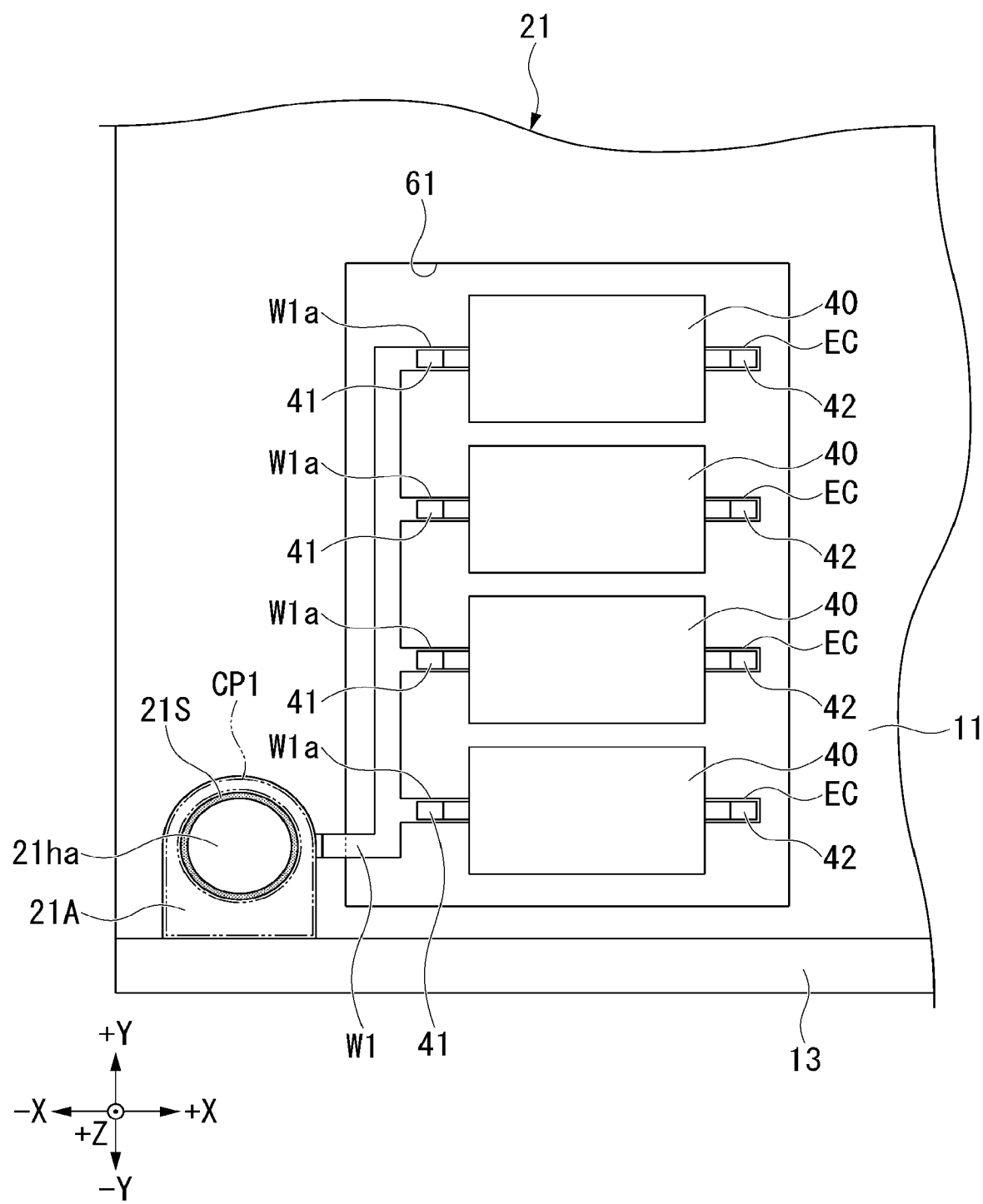
FIG. 13 is a plan view showing a first housing member and a capacitor of a second modified example according to the first embodiment.

FIG. 13 is a plan view showing the first housing member 21 and the capacitors 40 according to the first modified example. When viewed from the Z direction, the recess 61 is larger than the capacitors 40 in size. In other words, the area of the recess 61 is larger than the area on which the capacitors 40 are arranged. When viewed from the Z direction, the capacitors 40 are disposed inside the recess 61.

With this configuration, the distance between the capacitor 40 and the board 31 can be larger than a case in which the first main wall 11 does not have the recess 61. When the distance between the capacitor 40 and the board 31 can be larger, a degree of flexibility of a component to be disposed on a region of the first surface 31$a$ of the board 31 which overlaps the capacitors 40 in the Z direction increases. For example, a component having a relatively high height can be mounted on the region of the first surface 31$a$ of the board 31 which overlaps the capacitors 40 in the Z direction.

From another viewpoint, in the configuration according to the modified example, the distance between the first main wall 11 and the board 31 can be smaller than a case in which the first main wall 11 does not have the recess 61. When the distance between the first main wall 11 and the board 31 can be smaller, it is possible to achieve thinning and downsizing of the semiconductor storage device 1.

1.8.2 Second Modified Example

Figure 14:
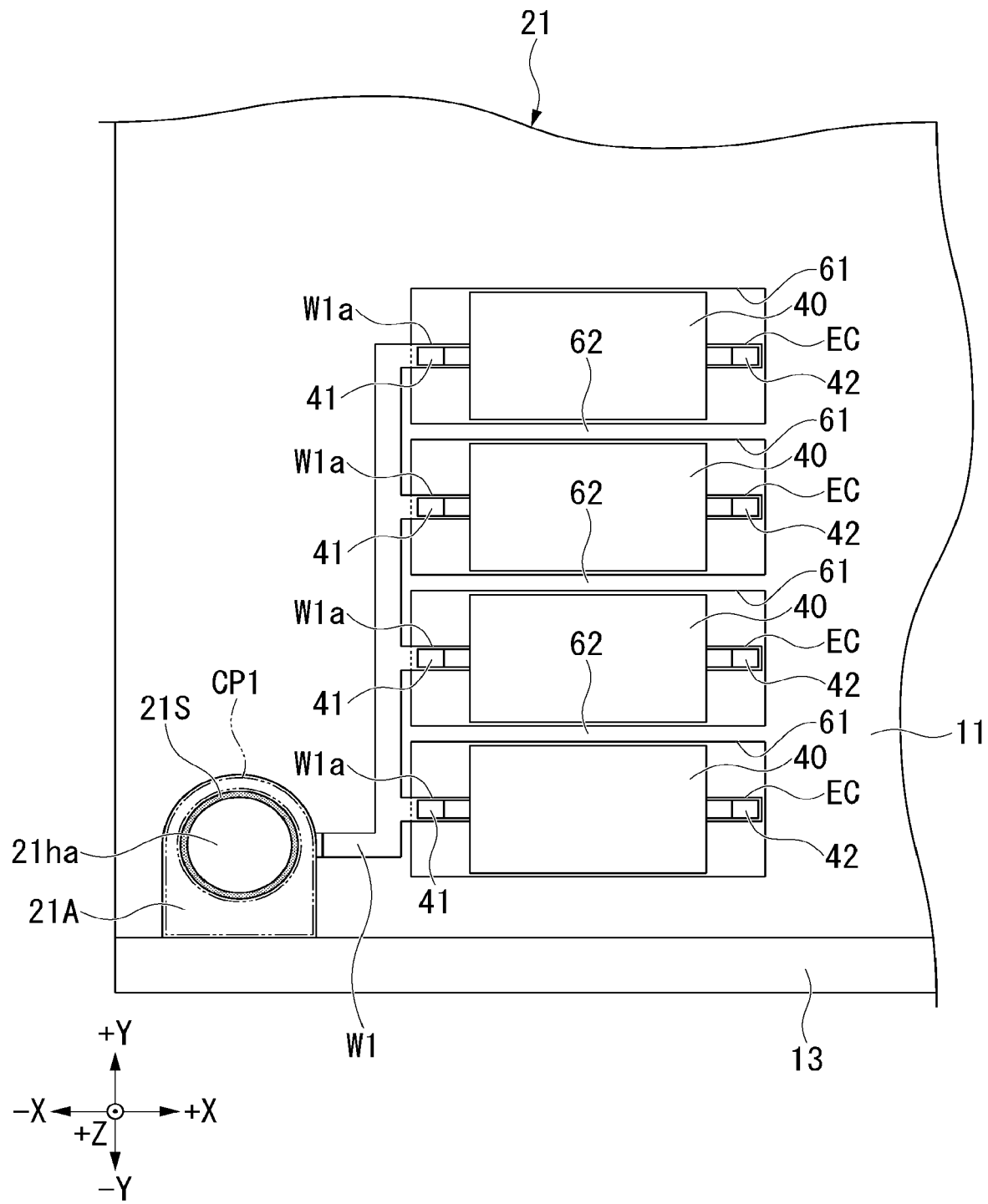
FIG. 14 is a plan view showing the first housing member and the capacitor of the second modified example according to the first embodiment.

FIG. 14 is a plan view showing the first housing member 21 and the capacitors 40 according to the second modified example. In the modified example, a plurality of recesses 61 are provided on the inner surface of the first main wall 11. The plurality of the recesses 61 are provided so as to correspond to the plurality of the capacitors 40 in one-to-one correspondence. The shape of each recess 61 is along the outer shape of the corresponding capacitor 40.

The first main wall 11 includes a protruding portion 62 that is provided between two recesses 61 adjacent to each other and forms a boundary portion between the recesses 61. The protruding portion 62 is a wall located between the two recesses 61 adjacent to each other. The protruding portion 62 protrudes from a bottom portion of the recess 61 in the +Z direction. The protruding portion 62 extends in a direction (the X direction) intersecting with the direction in which the plurality of the capacitors 40 align. In the modified example, the outer shape of the recess 61 functions as a guide (for example, the protruding portion 62 functions as a guide), and positioning of the capacitor 40 is carried out.

With this configuration, in addition to the advantage of the first modified example, the capacitors 40 can be easily mounted on the first main wall 11, and it is possible to improve manufacturability of the semiconductor storage device 1.

Second Embodiment

Next, a second embodiment will be described. The second embodiment is different from the first embodiment in that a first board 81 and a second board 91 are housed in the housing 10 and capacitors 40A are mounted on the second board 91. Note that, configurations other than those described below are the same as the configurations according to the first embodiment.

2.1 Overall Structure

Figure 15:
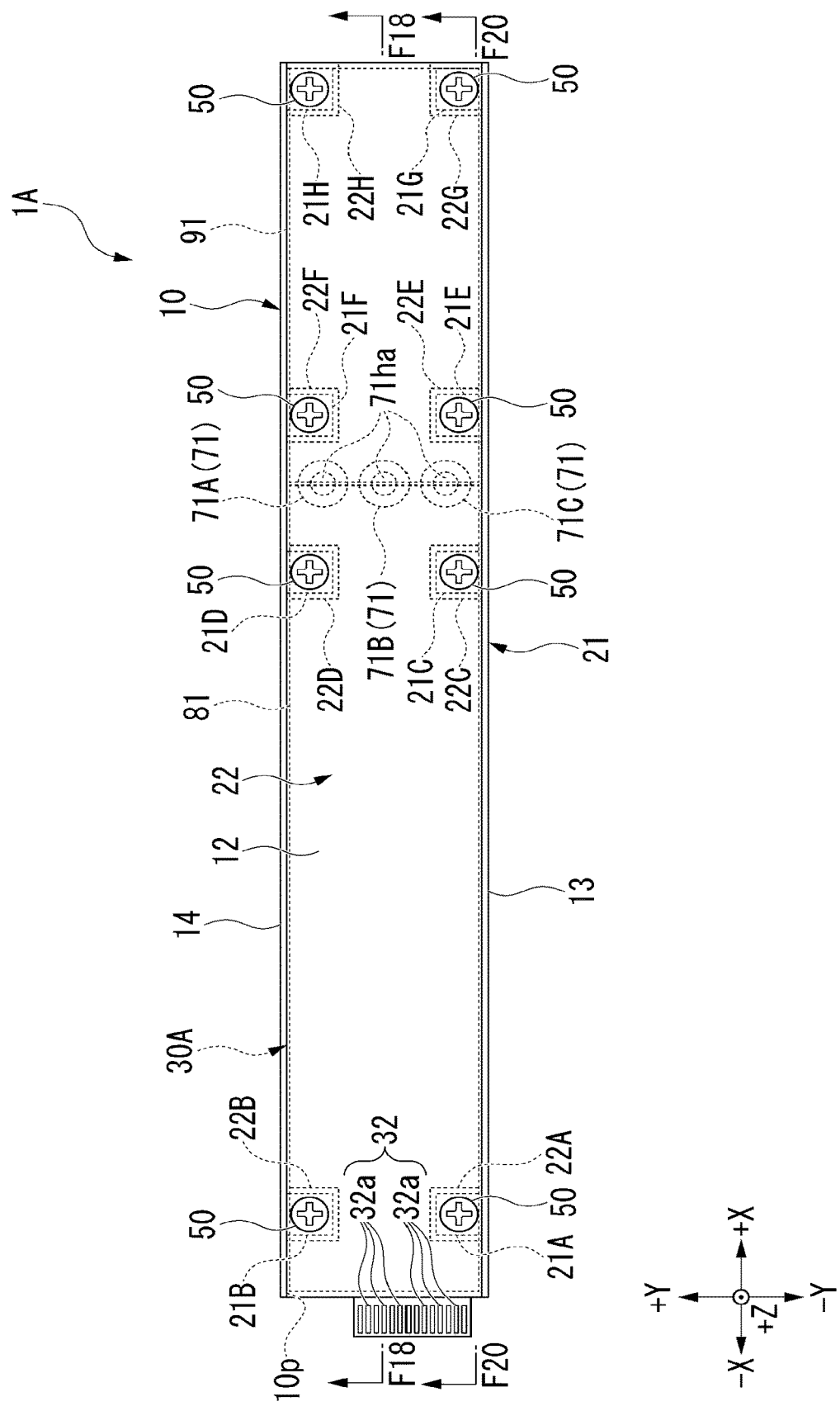
FIG. 15 is a plan view showing a semiconductor storage device according to a second embodiment.

FIG. 15 is a plan view showing a semiconductor storage device 1A according to the second embodiment. In the embodiment, the semiconductor storage device 1A includes the housing 10, a board unit 30A, a plurality of fixing members 110 (refer to FIG. 17), a plurality of electroconductive members 120 (refer to FIG. 17), and the plurality of the fixing members 50.

Similarly to the first embodiment, the housing 10 includes the first main wall 11 (refer to FIG. 18), the second main wall 12, the first side wall 13, and the second side wall 14. The shape of the housing 10 is a flat rectangular tube.

The housing 10 includes the first housing member 21 and the second housing member 22. The first housing member 21 includes the first main wall 11, the first side wall 13, and the second side wall 14. The second housing member 22 includes the second main wall 12.

In the embodiment, the first housing member 21 includes a support portion 21A, a support portion 21B, a support portion 21C, a support portion 21D, a support portion 21E, a support portion 21F, a support portion 21G, and a support portion 21H. The support portion 21A, the support portion 21B, the support portion 21C, the support portion 21D, the support portion 21E, the support portion 21F, the support portion 21G, and the support portion 21H are each a protruding portion provided on the first housing member 21.

The support portion 21A and the support portion 21C are provided so as to correspond to the end portion on the side in the −Y direction of the first board 81 which will be described below. The support portion 21A and the support portion 21C are apart from each other in the X direction. The support portion 21B and the support portion 21D are provided so as to correspond to the end portion of the first board 81 on the side in the +Y direction. The support portion 21B and the support portion 21D are apart from each other in the X direction.

The support portion 21E and the support portion 21G are provided so as to correspond to the end portion on the side in the −Y direction of the second board 91 which will be described below. The support portion 21E and the support portion 21G are apart from each other in the X direction. The support portion 21F and the support portion 21H are provided so as to correspond to the end portion of the second board 91 on the side in the +Y direction. The support portion 21F and the support portion 21H are apart from each other in the X direction. The fixation hole 21$ha$ to which the fixing member 50 is inserted and fixed (refer to FIG. 18) is provided at each of the support portion 21A, the support portion 21B, the support portion 21C, the support portion 21D, the support portion 21E, the support portion 21F, the support portion 21G, and the support portion 21H which are mentioned above. The fixation hole 21$ha$ is, for example, a screw hole.

On the other hand, the second housing member 22 includes a support portion 22A, a support portion 22B, a support portion 22C, a support portion 22D, a support portion 22E, a support portion 22F, a support portion 22G, and a support portion 22H. The support portion 22A, the support portion 22B, the support portion 22C, the support portion 22D, the support portion 22E, the support portion 22F, the support portion 22G, and the support portion 22H are each a protruding portion provided on the second housing member 22.

The support portion 22A, the support portion 22B, the support portion 22C, the support portion 22D, the support portion 22E, the support portion 22F, the support portion 22G, and the support portion 22H are disposed at positions (i.e., overlap the positions in the Z direction) corresponding to the support portion 21A, the support portion 21B, the support portion 21C, the support portion 21D, the support portion 21E, the support portion 21F, the support portion 21G, and the support portion 21H of the first housing member 21, respectively. The insertion hole 22$ha$ to which the fixing member 50 is inserted (refer to FIG. 18) is provided at each of the support portion 22A, the support portion 22B, the support portion 22C, the support portion 22D, the support portion 22E, the support portion 22F, the support portion 22G, and the support portion 22H which are mentioned above.

Furthermore, the housing 10 includes a support portion 71A, a support portion 71B, and a support portion 71C. The support portion 71A, the support portion 71B, and the support portion 71C are each a protruding portion provided on the first housing member 21 (or the second housing member 22).

The support portion 71A, the support portion 71B, and the support portion 71C are provided so as to correspond to a boundary portion between the first board 81 and the second board 91 in the X direction which will be described below. The support portion 71A, the support portion 71B, and the support portion 71C align in the Y direction. The support portion 71A, the support portion 71B, and the support portion 71C protrude from the first main wall 11 in the +Z direction (refer to FIG. 18). A fixation hole 71$ha$ which will be described below is provided on each of the support portion 71A, the support portion 71B, and the support portion 71C. The fixing member 110 is inserted into the fixation hole 71$ha$. The fixation hole 71$ha$ is, for example, a screw hole. Hereinbelow, when the support portion 71A, the support portion 71B, and the support portion 71C are not distinguished from each other, they will be referred to as "the support portion 71".

Figure 16:
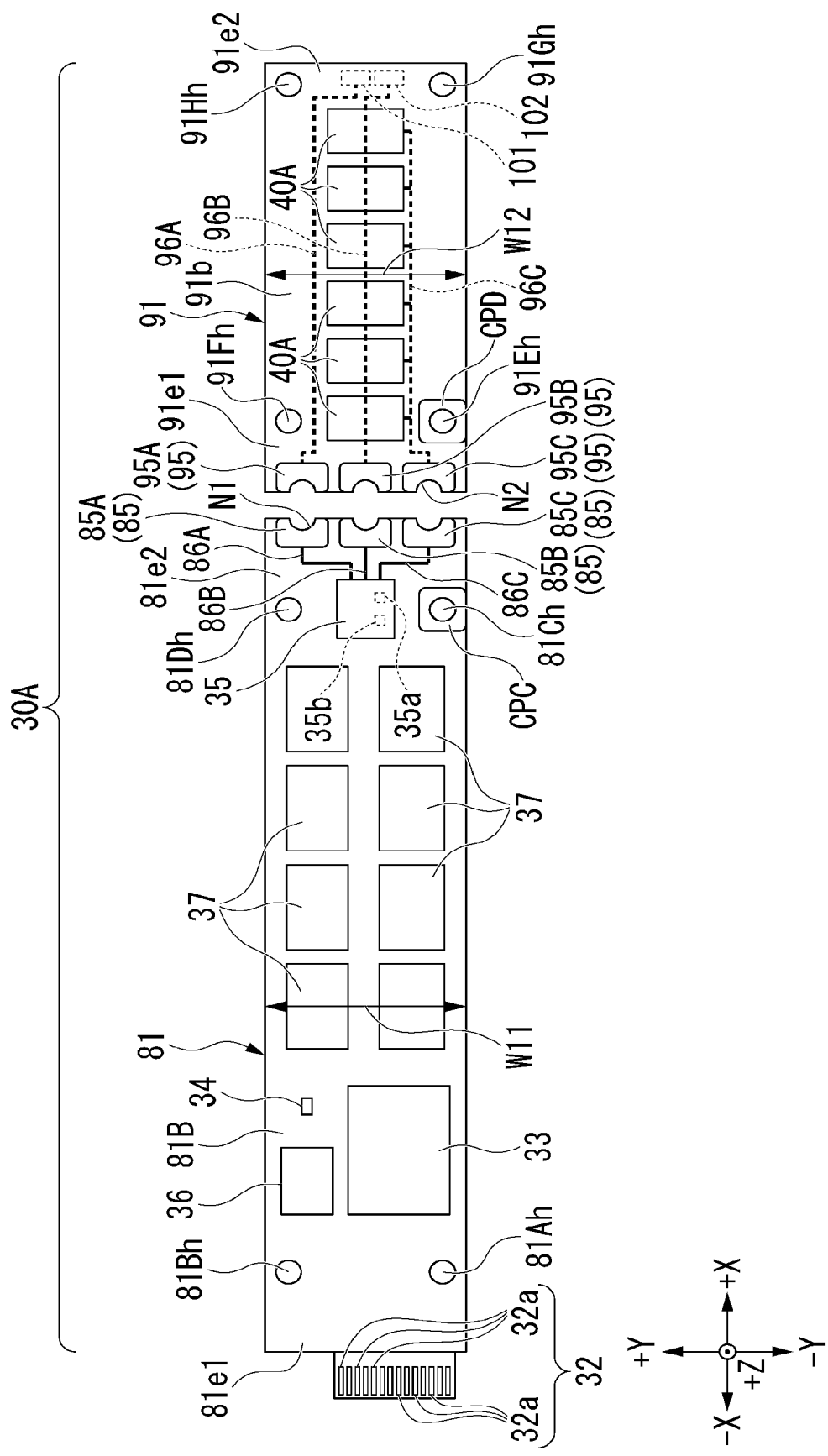
FIG. 16 is a partially exploded plan view showing a board unit according to the second embodiment.

Next, the board unit 30A housed in the housing 10 will be described. FIG. 16 is a partially exploded plan view showing the board unit 30A. The board unit 30A includes, for example, the first board 81, the external connector 32, the controller 33, the power converter 34, the power supply circuit component 35, the DRAM 36, the plurality of the memories 37, the second board 91, a first light emitting device 101 (first light emitting component), a second light emitting device 102 (second light emitting component), and a plurality of the capacitors 40A.

(First Board)

The first board 81 is a printed-wiring board. The first board 81 has sides extending in the X direction and the Y direction. The shape of the first board 81 is, for example, an elongated rectangular shape extending in the X direction. The first board 81 includes an insulating base member and a wiring pattern provided on the insulating base member. The first board 81 includes a conductive layer 82 including three or more layers layered in the Z direction (for example, four or more layers) (refer to FIG. 18). Such a conductive layer 82 configured by a plurality of layers includes at least one ground layer 82A.

The first board 81 includes a first surface 81$a$ (refer to FIG. 18), a second surface 81$b$, an insertion hole 81Ah, an insertion hole 81Bh, an insertion hole 81Ch, an insertion hole 81Dh, a first end portion 81$e$1, a second end portion 81$e$2, a first wiring 86A, a second wiring 86B, and a third wiring 86C.

The first surface 81$a$ is a surface directed to the −Z direction. The second surface 81$b$ is a surface directed to the +Z direction. The second surface 81*b* is located on the opposite side of the first surface 81*a*.

The insertion hole 81Ah, the insertion hole 81Bh, the insertion hole 81Ch, and the insertion hole 81Dh are each a hole penetrating through the first board 81 in the Z direction. The insertion hole 81Ah, the insertion hole 81Bh, the insertion hole 81Ch, and the insertion hole 81Dh are provided at positions (i.e., overlap the positions in the Z direction) corresponding to the fixation holes 21*ha* of the support portion 21A, the support portion 21B, the support portion 21C, and the support portion 21D of the first housing member 21, respectively. The fixing member 50 passes through each of the insertion hole 81Ah, the insertion hole 81Bh, the insertion hole 81Ch, and the insertion hole 81Dh. A conductive pad CPC is provided around the insertion hole 81Ch. The conductive pad CPC will be described below.

The first end portion 81*e*1 is the end portion on the side in the −X direction. A part of the first end portion 81*e*1 passes through an opening 10*p* of the housing 10 on the side in the −X direction and protrudes from the opening 10*p* toward the outside of the housing 10 (refer to FIG. 15). The external connector 32 is provided at the first end portion 81*e*1 of the first board 81.

The second end portion 81*e*2 of the first board 81 is an end portion on the opposite side of the first end portion 81*e*1. The second end portion 81*e*2 includes a first conductive pad 85A, a second conductive pad 85B, and a third conductive pad 85C. Hereinbelow, when the first conductive pad 85A, the second conductive pad 85B, and the third conductive pad 85C are not distinguished from each other, they will be simply referred to as "conductive pad 85".

The conductive pad 85 is an electrical connection portion provided on the first board 81. The conductive pad 85 is provided on the second surface 81*b* of the first board 81. The first board 81 includes cutout portions N1 corresponding one-to-one to the conductive pads 85. The cutout portions N1 are each a semicircular cutout portion provided at the second end portion 81*e*2 of the first board 81. A curvature radius of the cutout portion N1 is slightly larger than a diameter of an axis portion 112 (refer to FIG. 18) of the fixing member 110 which will be described below. The cutout portion N1 overlaps a part of the fixation hole 71*ha* of the support portion 71 of the first housing member 21 in the Z direction. The conductive pad 85 is adjacent to the cutout portion N1 in the three directions of the −X direction, the −Y direction, and the +Y direction. The first wiring 86A is a wiring line provided on the first board 81. The first wiring 86A is provided between the power supply circuit component 35 and the first conductive pad 85A. The first wiring 86A connects the power supply circuit component 35 and the first conductive pad 85A.

The second wiring 86B is a wiring line provided on the first board 81. The second wiring 86B is provided between the power supply circuit component 35 and the second conductive pad 85B. The second wiring 86B connects the power supply circuit component 35 and the second conductive pad 85B.

The third wiring 86C is a wiring line provided on the first board 81. The third wiring 86C is provided between the power supply circuit component 35 and the third conductive pad 85C. The third wiring 86C connects the power supply circuit component 35 and the third conductive pad 85C.

The controller 33, the power converter 34, the power supply circuit component 35, the DRAMs 36, and the plurality of the memories 37 are mounted on the first board 81. For example, the power supply circuit component 35 is arranged closer to the second end portion 81*e*2 of the first board 81 than the controller 33, the power converter 34, the DRAMs 36, and the plurality of the memories 37.

(Second Board)

The second board 91 is a printed-wiring board. The second board 91 has sides extending in the X direction and the Y direction. The shape of the second board 91 is, for example, an elongated rectangular shape extending in the X direction. The second board 91 is disposed on the side in the +X direction with respect to the first board 81. That is, the second board 91 is adjacent to the first board 81 in the longitudinal direction of the first board 81. A width W12 of the second board 91 in the Y direction is the same as a width W11 of the first board 81 in the Y direction. The position of the second board 91 in the Z direction is the same as the position of the second board 91 in the Z direction (refer to FIG. 18).

The second board 91 includes an insulating base member and a wiring pattern provided on the insulating base member. In the embodiment, a thickness T2 of the second board 91 in the Z direction is the same as a thickness T1 of the first board 81 in the Z direction (refer to FIG. 18). The second board 91 includes a conductive layer 92 including two or more layers layered in the Z direction (for example, three or more layers) (refer to FIG. 18). Such a conductive layer 92 configured by a plurality of layers includes at least one ground layer 92A.

The second board 91 has a layered structure having a number of layers smaller than that of the first board 81. For example, the number of layers of the conductive layer 92 which are layered in the second board 91 in the Z direction is smaller than the number of layers of the conductive layer 82 which are layered in the first board 81 in the Z direction.

The second board 91 includes a first surface 91*a* (refer to FIG. 18), a second surface 91*b*, an insertion hole 91Eh, an insertion hole 91Fh, an insertion hole 91Gh, an insertion hole 91Hh, a first end portion 91*e*1, a second end portion 91*e*2, a fourth wiring 96A, a fifth wiring 96B, and a sixth wiring 96C.

The first surface 91*a* is a surface directed to the −z direction. The second surface 91*b* is a surface directed to the +Z direction. The second surface 91*b* is located on the opposite side of the first surface 91*a*.

The insertion hole 91Eh, the insertion hole 91Fh, the insertion hole 91Gh, and the insertion hole 91Hh are each a hole penetrating through the second board 91 in the Z direction. The insertion hole 91Eh, the insertion hole 91Fh, the insertion hole 91Gh, and the insertion hole 91Hh are provided at positions (i.e., overlap the positions in the Z direction) corresponding to the fixation holes 21*ha* of the support portion 21E, the support portion 21F, the support portion 21G, and the support portion 21H of the first housing member 21, respectively. The fixing member 50 passes through each of the insertion hole 91Eh, the insertion hole 91Fh, the insertion hole 91Gh, and the insertion hole 91Hh. A conductive pad CPD is provided around the insertion hole 91Eh. The conductive pad CPD will be described below.

The first end portion 91*e*1 is the end portion on the side in the −X direction. The first end portion 91*e*1 is adjacent to the second end portion 81*e*2 of the first board 81 in the X direction.

The first end portion 91*e*1 includes a fourth conductive pad 95A, a fifth conductive pad 95B, and a sixth conductive pad 95C. Hereinbelow, when the fourth conductive pad 95A, the fifth conductive pad 95B, and the sixth conductive pad 95C are not distinguished from each other, they will be simply referred to as "conductive pad 95".

The conductive pad 95 is an electrical connection portion provided on the second board 91. The conductive pad 95 is provided on the second surface 91b of the second board 91. The second board 91 includes cutout portions N2 corresponding one-to-one to the conductive pads 95. The cutout portions N2 are each a semicircular cutout portion provided at the first end portion 91e1 of the second board 91. A curvature radius of the cutout portion N2 is slightly larger than a diameter of an axis portion 112 (refer to FIG. 18) of the fixing member 110 which will be described below. The cutout portion N2 overlaps a part of the fixation hole 71ha of the corresponding support portion 71 in the Z direction. The conductive pad 95 is adjacent to the cutout portion N2 in the three directions of the +X direction, the −Y direction, and the +Y direction.

The second end portion 91e2 is the end portion on the side in the +X direction. The second end portion 91e2 is located on the opposite side of the first end portion 91e1. The first light emitting device 101 and the second light emitting device 102 which will be described below are mounted on the second end portion 91e2.

The fourth wiring 96A is a wiring line provided on the second board 91. The fourth wiring 96A is provided between the fourth conductive pad 95A and an anode of the first light emitting device 101. The fourth wiring 96A includes, for example, a through hole extending from the first surface 91a to the second surface 91b of the second board 91. The fourth wiring 96A connects the fourth conductive pad 95A and the anode of the first light emitting device 101.

The fifth wiring 96B is a wiring line provided on the second board 91. The fifth wiring 96B is provided between the fifth conductive pad 95B and an anode of the second light emitting device 102. The fifth wiring 96B includes, for example, a through hole extending from the first surface 91a to the second surface 91b of the second board 91. The fifth wiring 96B connects the fifth conductive pad 95B and the anode of the second light emitting device 102. On the other hand, a cathode of the second light emitting device 102 is connected to the ground layer 92A of the second board 91 via a wiring which is not shown in the drawings (refer to FIG. 18).

The sixth wiring 96C is a wiring line provided on the second board 91. The sixth wiring 96C is provided between the sixth conductive pad 95C and the first terminal 41 of each of the plurality of the capacitors 40A. The sixth wiring 96C connects the sixth conductive pad 95C and the first terminal 41 of each of the plurality of the capacitors 40A. In the embodiment, the plurality of the capacitors 40A are electrically connected in parallel to the sixth wiring 96C. Instead of this connection, the plurality of the capacitors 40A may be electrically connected in series to the sixth wiring 96C.

(First Light Emitting Device)

The first light emitting device 101 is a device including a light-emitting element. The first light emitting device 101 is, for example, an LED (Light Emitting Diode). The first light emitting device 101 is provided on, for example, the first surface 91a of the second board 91. Light emission from the first light emitting device 101 is visible from the outside via a window portion provided on the housing 10 which is not shown in the drawings.

The anode of the first light emitting device 101 is connected to the fourth conductive pad 95A via the fourth wiring 96A. On the other hand, a cathode of the first light emitting device 101 is connected to the ground layer 92A of the second board 91 via a wiring which is not shown in the drawings (refer to FIG. 18).

(Second Light Emitting Device)

The second light emitting device 102 is a device including a light-emitting element. The second light emitting device 102 is, for example, an LED. The second light emitting device 102 is provided on, for example, the first surface 91a of the second board 91. Light emission from the second light emitting device 102 is visible from the outside via a window portion provided on the housing 10 which is not shown in the drawings.

The anode of the second light emitting device 102 is connected to the fifth conductive pad 95B via the fifth wiring 96B. On the other hand, the cathode of the second light emitting device 102 is connected to the ground layer 92A of the second board 91 via a wiring which is not shown in the drawings.

(Capacitor)

The plurality of the capacitors 40A are provided separately on, for example, the first surface 91a and the second surface 91b of the second board 91. The capacitor 40A is, for example, a tantalum capacitor. The first terminal 41 of each of the plurality of the capacitors 40A is connected to the sixth conductive pad 95C via the sixth wiring 96C. On the other hand, the second terminal 42 of each of the plurality of the capacitors 40A is connected to the ground layer 92A of the second board 91 via a wiring which is not shown in the drawings (refer to FIG. 18).

Figure 17:
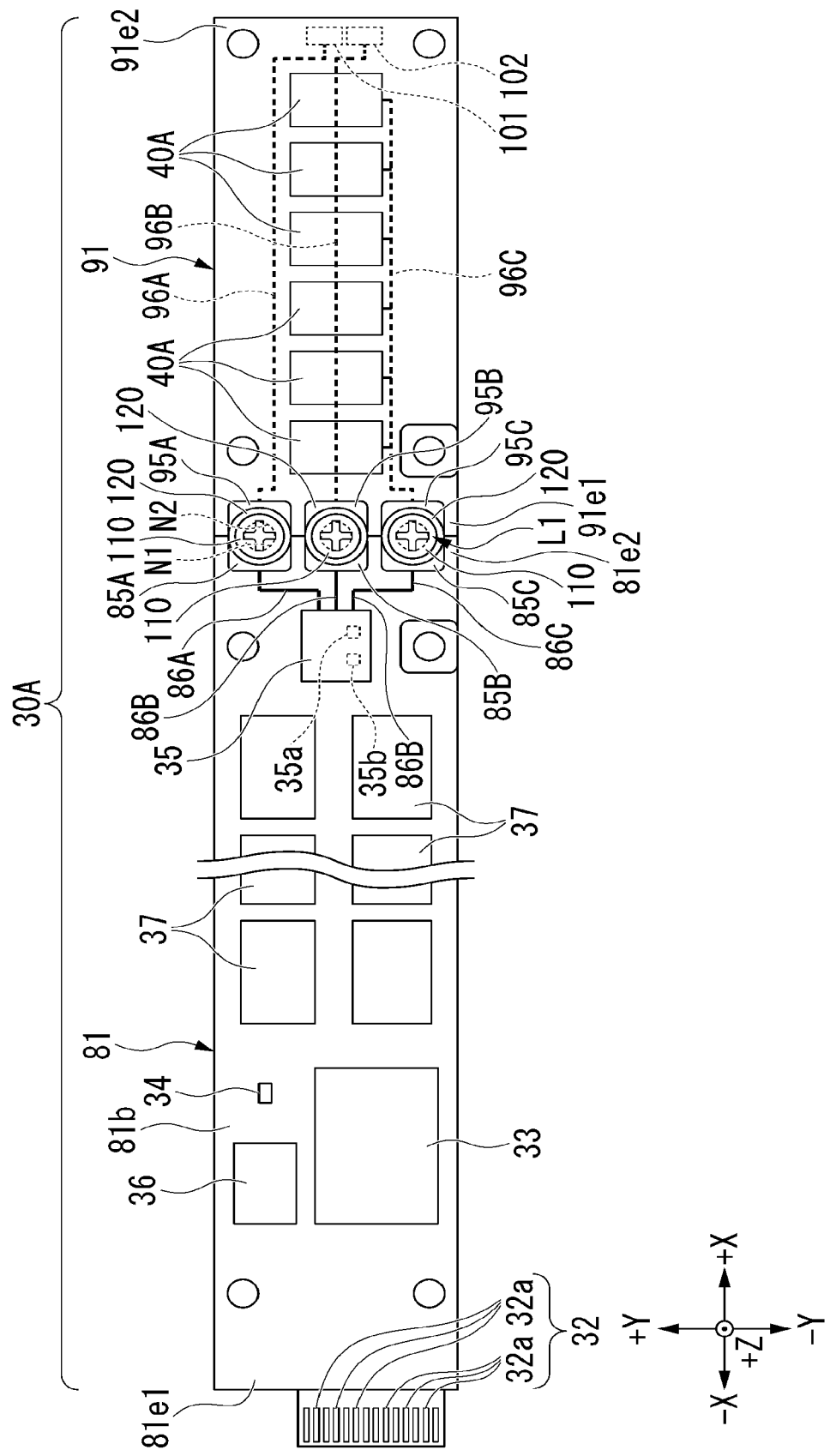
FIG. 17 is a plan view showing a structure associated with the board unit according to the second embodiment.

2.2 Connection Configuration Between First Board and Second Board Regarding Anode Next, a connection configuration regarding the anode between the first board 81 and the second board 91 will be described. FIG. 17 is a plan view showing a structure associated with the board unit 30A. In the embodiment, the first board 81 and the second board 91 are arranged such that the cutout portions N1 of the first board 81 face the cutout portions N2 of the second board 91 in the X direction. Furthermore, the fixing member 110 and the electroconductive member 120 are attached to the conductive pad 85 of the first board 81 and the conductive pad 95 of the second board 91 so as to bridge the conductive pad 85 and the conductive pad 95.

Figure 18:
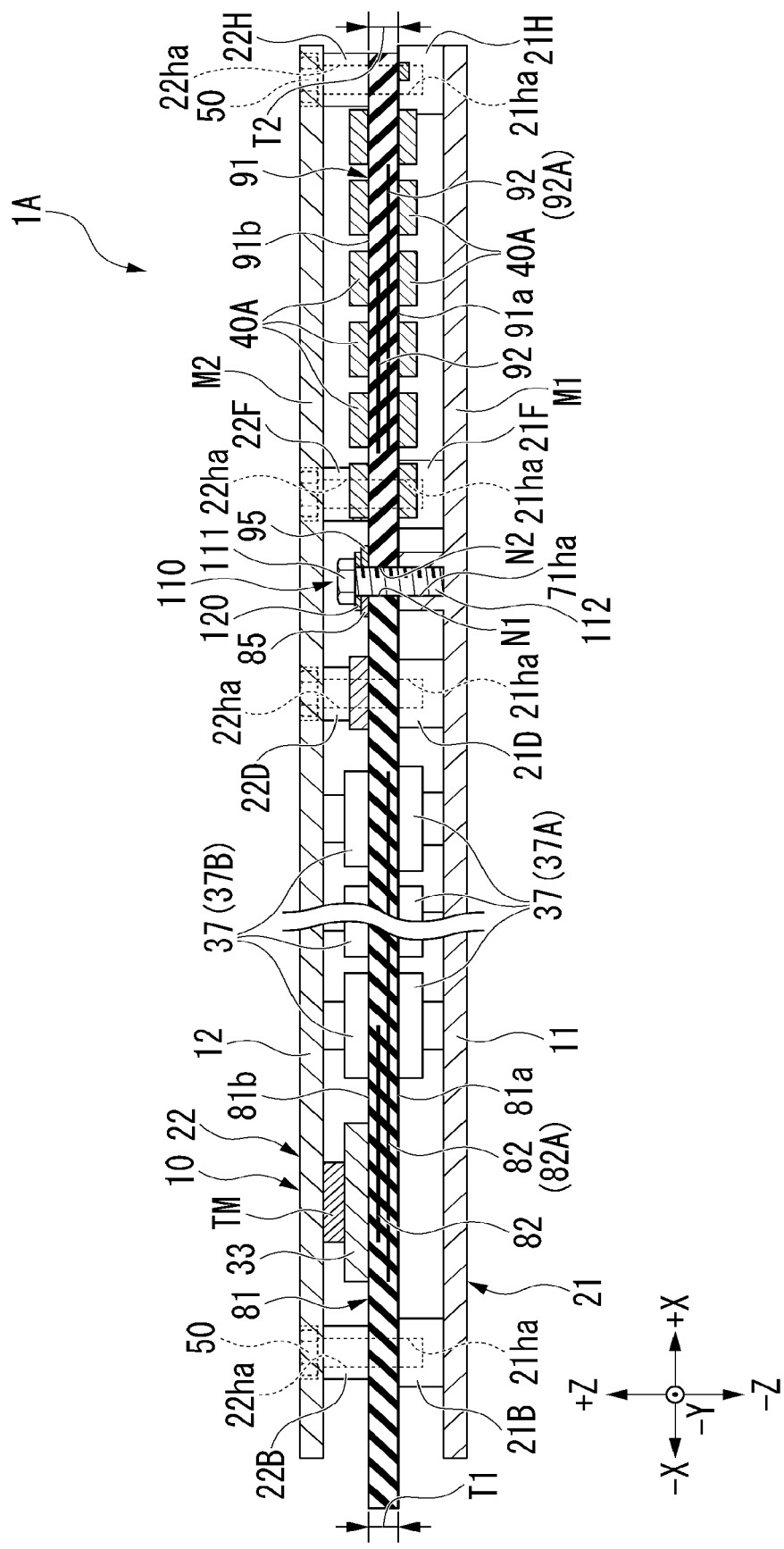
FIG. 18 is a cross-sectional view taken along line F18-F18 of the semiconductor storage device shown in FIG. 15.

FIG. 18 is a cross-sectional view taken along line F18-F18 of the semiconductor storage device 1A shown in FIG. 15. In the embodiment, the fixing member 110 is a screw having insulation. The fixing member 110 includes a head portion 111 and an axis portion 112. The head portion 111 faces the conductive pad 85 of the first board 81 and the conductive pad 95 of the second board 91 from the side in the +Z direction. The axis portion 112 is thinner than the head portion 111. A screw thread is provided on the axis portion 112. The axis portions 112 pass through the cutout portions N1 of the first board 81 and the cutout portions N2 of the second board 91. The axis portions 112 are inserted into the fixation hole 71ha of the support portion 71.

The electroconductive member 120 is held among the head portion 111 of the fixing member 110, the conductive pad 85 of the first board 81, and the conductive pad 95 of the second board 91. The electroconductive member 120 is an electrical connection member that connects the conductive pad 85 of the first board 81 and the conductive pad 95 of the second board 91. The electroconductive member 120 is, for example, a metal spring washer. The head portion 111 of the fixing member 110 presses against the electroconductive member 120 toward the conductive pad 85 of the first board 81 and the conductive pad 95 of the second board 91. Accordingly, the electroconductive member 120 is connected to the conductive pad 85 of the first board 81. Additionally, the electroconductive member 120 is connected to the conductive pad 95 of the second board 91.

Therefore, the first conductive pad 85A of the first board 81 is connected to the fourth conductive pad 95A of the second board 91. Moreover, the second conductive pad 85B of the first board 81 is connected to the fifth conductive pad 95B of the second board 91. In addition, the third conductive pad 85C of the first board 81 is connected to the sixth conductive pad 95C of the second board 91.

Figure 19:
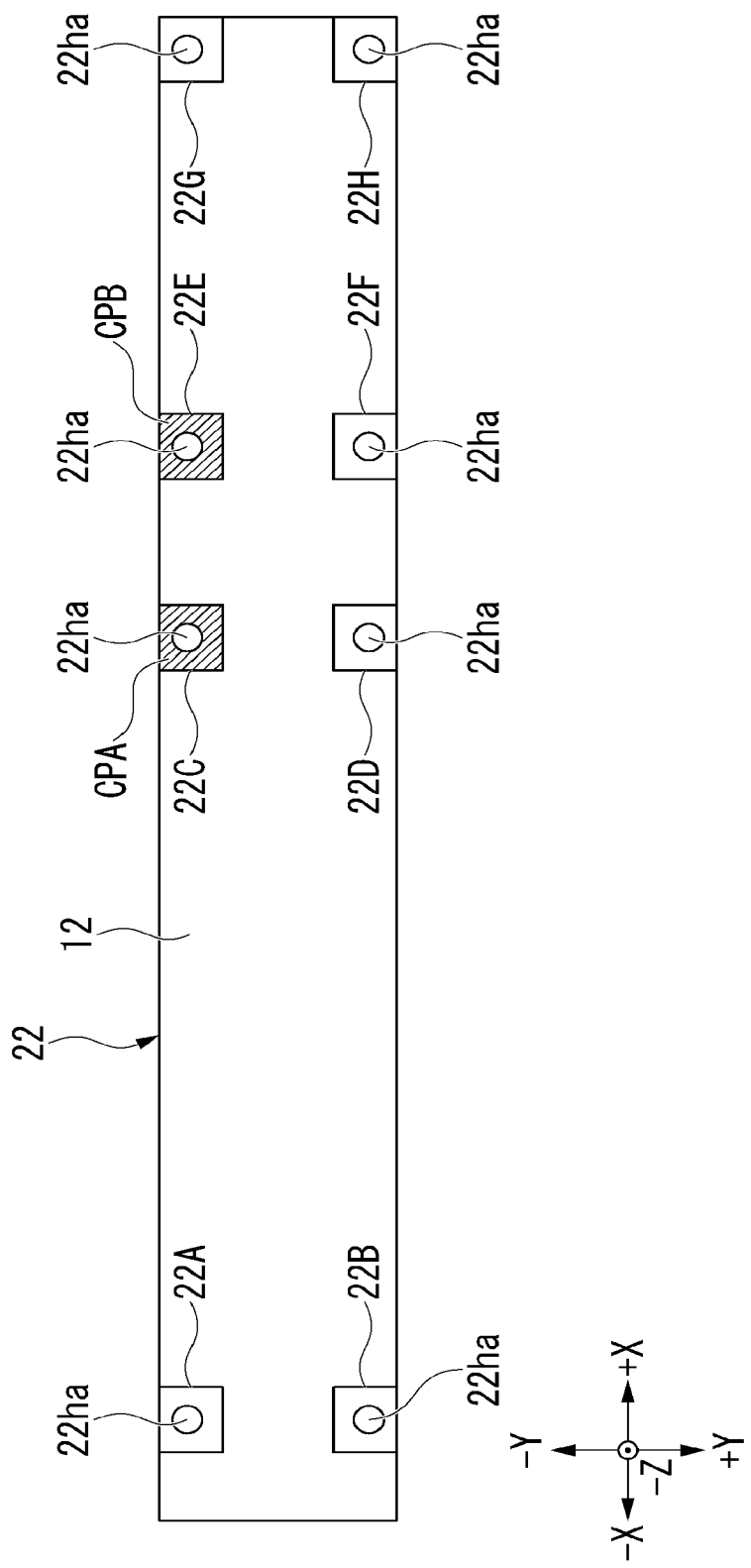
FIG. 19 is a bottom view showing a second housing member according to the second embodiment.

2.3 Connection Configuration Between First Board and Second Board Regarding Cathode Next, a connection configuration regarding the cathode between the first board 81 and the second board 91 will be described. FIG. 19 is a bottom view showing the second housing member 22. For convenience of explanation, in FIG. 19, the conductive pads CPA and CPB are represented by hatching.

In the embodiment, the conductive pad CPA is provided on an end face of the support portion 22C on the side in the –Z direction. The conductive pad CPA is an electrical connection portion provided on the second housing member 22. When viewed from the Z direction, the outer shape of the conductive pad CPA is the same as the outer shape of the support portion 22C. The conductive pad CPA is provided around the insertion hole 22ha of the support portion 22C. In the embodiment, a part of the insulating layer I2 of the second housing member 22 is removed, and a part of the conductive pad CPA is implanted into the removed portion. Because of this, the conductive pad CPA is connected to the metal portion M2 of the second housing member 22.

The conductive pad CPB is provided on an end face of the support portion 22E on the side in the –Z direction. The conductive pad CPB is an electrical connection portion provided on the second housing member 22. When viewed from the Z direction, the outer shape of the conductive pad CPB is the same as the outer shape of the support portion 22E. The conductive pad CPB is provided around the insertion hole 22ha of the support portion 22E. In the embodiment, a part of the insulating layer I2 of the second housing member 22 is removed, and a part of the conductive pad CPB is implanted into the removed portion. Because of this, the conductive pad CPB is connected to the metal portion M2 of the second housing member 22.

On the other hand, a conductive pad is not provided on the support portion 22A, the support portion 22B, the support portion 22D, the support portion 22F, the support portion 22G, and the support portion 22H.

Figure 20:
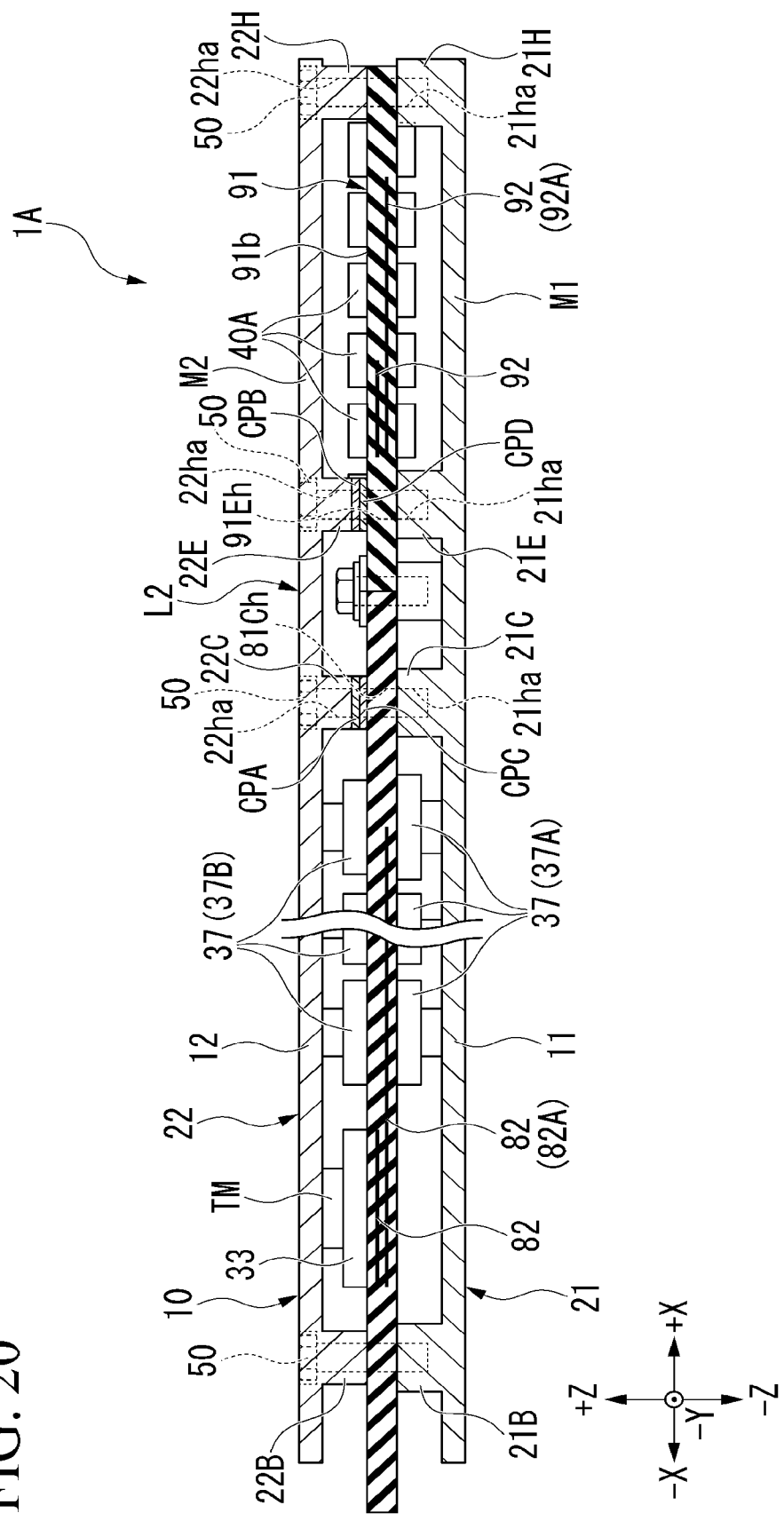
FIG. 20 is a cross-sectional view taken along line F20-F20 of the semiconductor storage device shown in FIG. 15.

FIG. 20 is a cross-sectional view taken along line F20-F20 of the semiconductor storage device 1A shown in FIG. 15. The first board 81 includes the conductive pad CPC. The conductive pad CPC is an electrical connection portion provided on the first board 81. The conductive pad CPC is provided on the second surface 81b of the first board 81. The conductive pad CPC faces the conductive pad CPA of the support portion 22C in the Z direction. The conductive pad CPC is connected to the conductive pad CPA by being in contact with the conductive pad CPA of the support portion 22C. The conductive pad CPC is provided around the insertion hole 81Ch of the first board 81 (refer to FIG. 16). The conductive pad CPC is electrically connected to the ground layer 82A of the first board 81.

The second board 91 includes the conductive pad CPD. The conductive pad CPC is an electrical connection portion provided on the second board 91. The conductive pad CPD is provided on the second surface 91b of the second board 91. The conductive pad CPD faces the conductive pad CPB of the support portion 22E in the Z direction. The conductive pad CPD is connected to the conductive pad CPB by being in contact with the conductive pad CPB. The conductive pad CPD is provided around the insertion hole 91Eh (refer to FIG. 16). The conductive pad CPD is electrically connected to the ground layer 92A of the second board 91.

Consequently, the cathode connection line L2 including the ground layer 92A of the second board 91, the conductive pad CPD of the second board 91, the conductive pad CPB of the support portion 22E, the metal portion M2 of the second housing member 22, the conductive pad CPA of the support portion 22C, the conductive pad CPC of the first board 81, and the ground layer 82A of the first board 81 is formed.

2.4 Function

The anode connection line L1 including a wiring 86C of the first board 81, the conductive pad 85C of the first board 81, the electroconductive member 120, the conductive pad 95C of the second board 91, and a wiring 96C of the second board 91 is formed between the anode power supply 35a of the power supply circuit component 35 and the first terminal 41 of the capacitor 40A (refer to FIG. 17). On the other hand, the cathode connection line L2 including the ground layer 92A of the second board 91, the conductive pad CPD of the second board 91, the conductive pad CPB of the support portion 22E, the metal portion M2 of the second housing member 22, the conductive pad CPA of the support portion 22C, the conductive pad CPC of the first board 81, and the ground layer 82A of the first board 81 is formed between the second terminal 42 of the capacitor 40A and the cathode power supply 35b of the power supply circuit component 35 (refer to FIG. 20).

Consequently, until the capacitors 40A are fully charged up, an electrical current returning to the power supply circuit component 35 flows from the power supply circuit component 35 via the anode connection line L1, the capacitors 40A, and the cathode connection line L2, and the capacitors 40A are charged up. On the other hand, when power supply from the host device to the semiconductor storage device 1A is unexpectedly shut off, the electrical power charged by the capacitors 40A is supplied from the capacitors 40A to the power supply circuit component 35 via the anode connection line L1.

2.4 Advantage

According to the configuration of the embodiment, the capacitors 40A are fixed to the second board 91 and are electrically connected to the first board 81. With this configuration, there are at least one or more advantages of (1) and (2) described below.

(1) It is possible to achieve manufacturability of the semiconductor storage device 1A. Particularly, as shown in the embodiment, when the capacitors 40A are mounted on the second board 91 different from the first board 81, it is possible to separately carry out the process of mounting the devices such as the controller 33, the memories 37, or the like on the first board 81 and the process of mounting the capacitors 40A on the second board 91 (for example, the processes can be carried out in parallel). Accordingly, it is possible to achieve manufacturability of the semiconductor storage device 1A.

(2) It is easy to remove the capacitors 40A. For example, in order to analyze a failure, it may be necessary to remove a component or a device which was mounted on the board (rework) after the failure occurred. In the embodiment, since the capacitors 40A are fixed to the second board 91, the capacitors 40A can be easily separated from the first board 81 as compared to a case in which the capacitors 40A are mounted on the first board 81. Accordingly, it is possible to increase a degree of workability of rework.

In the embodiment, the second board 91 has a layered structure having a number of layers smaller than that of the first board 81. With this configuration, there are at least one or more advantages of (3) and (4) described below.

(3) It is possible to achieve cost reduction of the semiconductor storage device 1A. When the number of layers of the second board 91 is smaller than that of the first board 81, it is possible to reduce the area of the second board 91 formed of a multilayered board more expensive than the first board 81. Accordingly, it is possible to achieve cost reduction of the semiconductor storage device 1A.

(4) It is possible to suppress degradation of the capacitors 40A. Here, when the number of layers of the second board 91 is smaller than that of the first board 81, a ratio of a conductive layer having a high coefficient of thermal conductivity to the entire second board 91 is smaller than that of the first board 81. Consequently, heat generated from the heat generator of the first board 81 is less easily transferred to the capacitors 40A of the second board 91, and an increase in temperatures of the capacitors 40A is suppressed. Accordingly, it is possible to suppress degradation of the capacitors 40A.

2.5 Modified Example

Next, a modified example according to the second embodiment will be described. Note that, configurations other than those described below are the same as those of the second embodiment.

Figure 21:
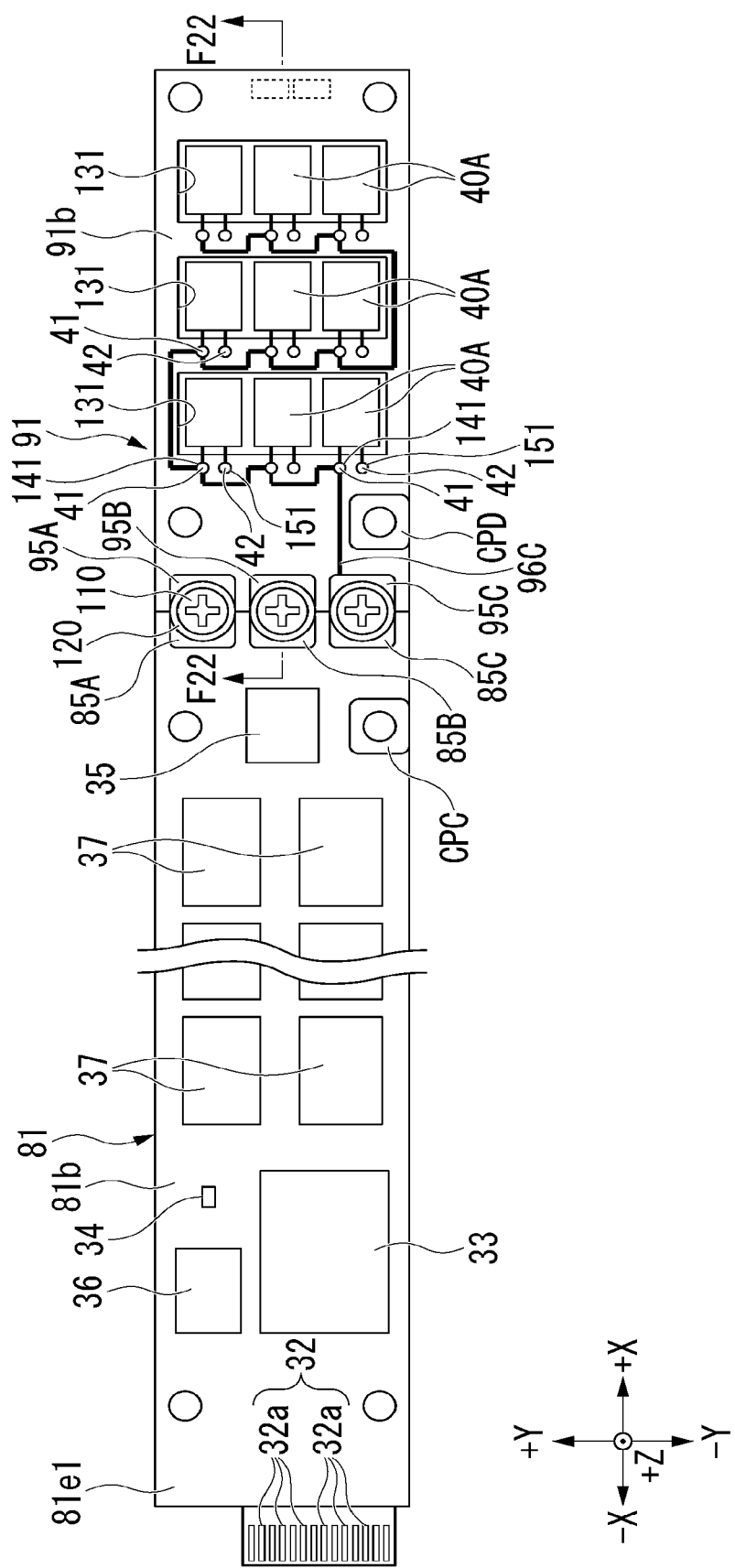
FIG. 21 is a plan view showing a structure associated with the board unit of a modified example according to the second embodiment.

FIG. 21 is a plan view showing a structure associated with the board unit 30A according to the modified example. In the modified example, the plurality of the capacitors 40A are each an aluminum electrolytic capacitor. A thickness of the aluminum electrolytic capacitor is, for example, twice or more a thickness of a tantalum capacitor.

In the modified example, each of the first surface 91a and the second surface 91b of the second board 91 has a recess 131. The recess 131 is provided on a region corresponding to the capacitors 40A. The thickness of the second board 91 is thin in the Z direction at the recesses 131. The recess 131 is a recess provided on the second board 91. When viewed from the Z direction, the capacitors 40A are disposed inside the recesses 131. In FIG. 21, for example, three capacitors 40A are disposed inside one recess 131.

In the modified example, the first terminals 41 of the capacitors 40A are each a lead inserted into a through hole 141 of the second board 91. In the modified example, the first terminals 41 of the plurality of the capacitors 40A are electrically connected in series to each other. For example, the first terminals 41 of the plurality of the capacitors 40A are electrically connected in series to each other via a wiring 96C provided on the second board 91.

Figure 22:
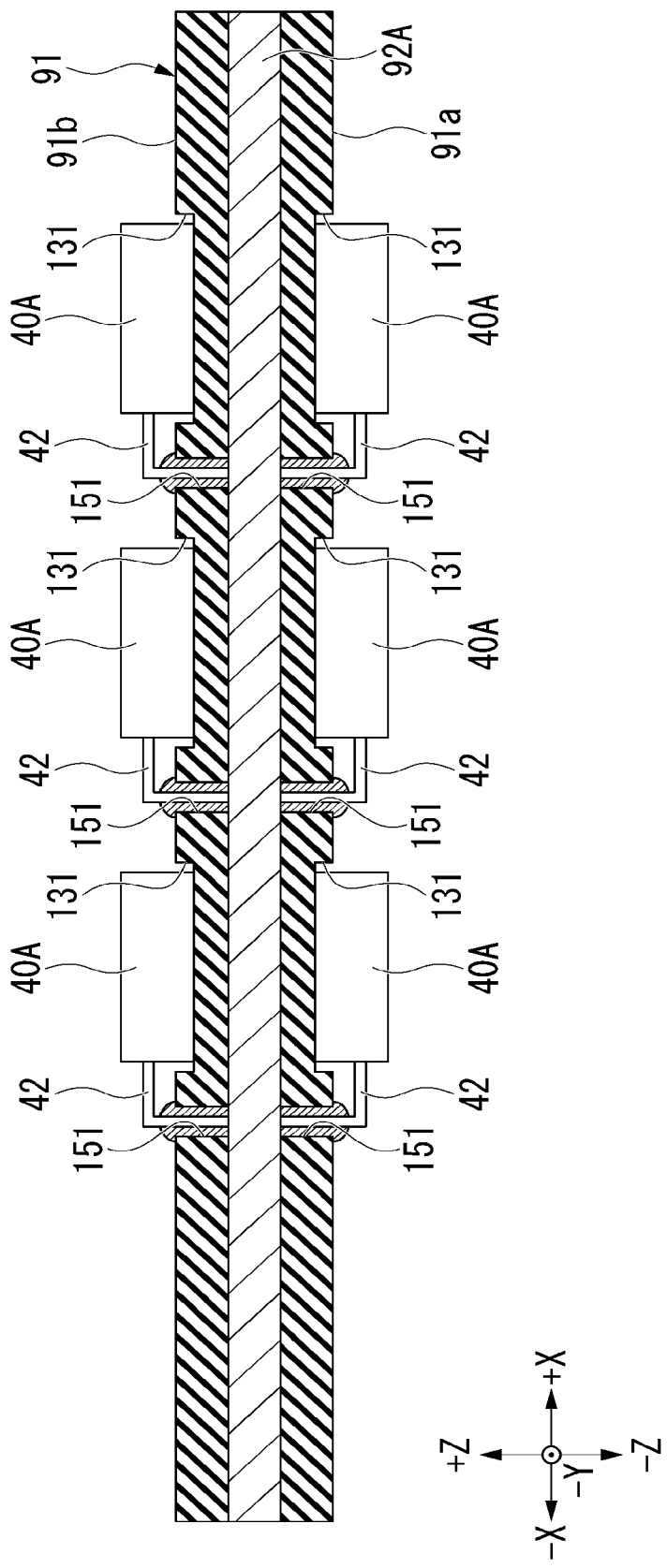
FIG. 22 is a cross-sectional view taken along line F22-F22 of a second board shown in FIG. 21.

FIG. 22 is a cross-sectional view taken along line F22-F22 of the second board 91 shown in FIG. 21. The second terminal 42 of each of the plurality of the capacitors 40A is a lead inserted into a through hole 151 provided on the second board 91. The second terminal 42 of each of the plurality of the capacitors 40A is connected to the ground layer 92A of the second board 91 via the through hole 151. Similarly to the aforementioned second embodiment, the ground layer 92A of the second board 91 is connected to the cathode power supply 35b of the power supply circuit component 35 via the cathode connection line L2.

Even with this configuration, it is possible to obtain the same advantages as those of the second embodiment. In the modified example, the second board 91 includes the recesses 131 on which the capacitors 40A are disposed. With this configuration, it is possible to provide a configuration contributing to thinning of the semiconductor storage device 1A.

While some embodiments and modified examples have been described above, the embodiments and the modified examples are not limited to the above examples. For example, two or more of the embodiments and the modified examples described above may be realized by combination thereof to each other.

According to at least one of the embodiments described above, the storage device includes a capacitor that is fixed to a housing or to a second board housed in the housing and that is electrically connected to a first board. With this configuration, it is possible to achieve manufacturability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
 a housing including a first support portion, a second support portion, and a metal portion, the first support portion having a first support conductive pad, the second support portion having a second support conductive pad;
 a first board in the housing, the first board including a first ground layer and a first facing conductive pad, the first ground layer being electrically connected to the first facing conductive pad, the first facing conductive pad being electrically connected to the first support conductive pad;
 a memory on the first board;
 a second board in the housing, the second board not overlapping the first board in a thickness direction of the first board, the second board being adjacent to the first board in a longitudinal direction intersecting with the thickness direction of the first board, the second board including a second ground layer and a second facing conductive pad, the second ground layer being electrically connected to the second facing conductive pad, the second facing conductive pad being electrically connected to the second support conductive pad,
 a plurality of capacitors in contact with the second board, the plurality of the capacitors including first terminals in one-to-one correspondence with the plurality of the capacitors and second terminals in one-to-one correspondence with the plurality of the capacitors, the plurality of the capacitors being electrically connected to the first board;

a first wiring commonly connected to the first terminals, the first wiring at least electrically connecting the capacitors and the first board, the first wiring being on the second board;

a first conductive pad provided on the first board;

a second conductive pad provided on the second board;

an electroconductive member between the first conductive pad and the second conductive pad, the electroconductive member electrically connecting the first conductive pad and the second conductive pad; and a fixing member pressing against the electroconductive member to electrically connect the first conductive pad and the second conductive pad, wherein the first terminals are electrically connected to the first conductive pad via the electroconductive member, the second conductive pad, and the first wiring, wherein the second ground layer, the second conductive pad, the second support conductive pad, the metal portion, the first support conductive pad, and the first conductive pad form a connection line, and wherein the second terminals are connected to the connection line.

2. The storage device according to claim 1, wherein the capacitor is fixed to the housing.

3. The storage device according to claim 2, wherein the housing includes a wiring, the housing has an inner surface, the wiring is on the inner surface of the housing, and the capacitor is connected to the first board via the wiring.

4. The storage device according to claim 3, wherein the housing includes a conductor, the conductor has a flat portion facing the first board, and the wiring is connected to the first board via the conductor.

5. The storage device according to claim 4, wherein the housing includes a first wall portion and a support portion, the support portion protrudes from the first wall portion in a thickness direction of the first board, the support portion supports the first wall portion, and the conductor is on the support portion.

6. The storage device according to claim 5, wherein the housing includes a first member, a second member, and a fixing member, the first member includes the first wall portion and the support portion, the second member includes a second wall portion on an opposite side of the first wall portion with respect to the first board, the fixing member fixes the first member and the second member, the support portion has a fixation hole, the fixing member is inserted into the fixation hole, and the conductor is around the fixation hole.

7. The storage device according to claim 6, wherein the support portion includes an insulating portion between the conductor and the fixation hole.

8. The storage device according to claim 3, wherein the housing includes a metal portion, the capacitor includes a cathode, and the cathode of the capacitor is electrically connected to the metal portion.

9. The storage device according to claim 8, wherein the capacitor includes an anode, the first board has a first surface, a second surface, a first electrode, and a second electrode, the second surface is on an opposite side of the first surface, the first electrode is on the first surface and is connected to the anode of the capacitor via the wiring, and the second electrode is on the second surface and is connected to the cathode of the capacitor via the metal portion.

10. The storage device according to claim 1, wherein the housing includes a first wall portion and a support portion, the support portion protrudes from the first wall portion in a thickness direction of the first board, the support portion supports the first wall portion, and the plurality of the capacitors are in a height range of the support portion in the thickness direction of the first board.

11. The storage device according to claim 1, wherein the housing has a recess, the recess is recessed in a direction away from the first board in a thickness direction of the first board, and when viewed from the thickness direction of the first board, the capacitor is inside the recess.

12. The storage device according to claim 1, wherein the second board has a layer structure having a number of layers smaller than that of the first board.

13. The storage device according to claim 1, wherein the plurality of the capacitors are separated from the first board.

14. The storage device according to claim 1, wherein the plurality of the capacitors align on the second board.

15. The storage device according to claim 14, wherein the second board has a first surface and a second surface, and the plurality of the capacitors are provided on both the first surface and the second surface of the second board.

16. The storage device according to claim 1, wherein the second board has recesses, and the plurality of the capacitors are disposed on the recesses.

17. The storage device according to claim 16, wherein the second board has a first surface and a second surface, each of the first surface and the second surface has recesses, and the plurality of the capacitors are disposed on the recesses of the first surface and the recesses of the second surface.

18. The storage device according to claim 1, wherein the fixing member has insulation, and the electroconductive member is fixed to the housing by the fixing member.

19. The storage device according to claim 1, wherein the electroconductive member includes a metal spring washer.

20. The storage device according to claim 1, wherein the plurality of the capacitors include an electrolytic capacitor.

* * * * *